(12) United States Patent
Chen et al.

(10) Patent No.: US 11,837,539 B2
(45) Date of Patent: Dec. 5, 2023

(54) ELECTRICAL FUSE BIT CELL IN INTEGRATED CIRCUIT HAVING BACKSIDE CONDUCTING LINES

(71) Applicant: TAIWAN SEMICONDUCTOR MANUFACTURING COMPANY, LTD., Hsinchu (TW)

(72) Inventors: Chien-Ying Chen, Hsinchu (TW); Yen-Jen Chen, Hsinchu (TW); Yao-Jen Yang, Hsinchu (TW); Meng-Sheng Chang, Hsinchu (TW); Chia-En Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 279 days.

(21) Appl. No.: 17/412,999

(22) Filed: Aug. 26, 2021

(65) Prior Publication Data

US 2023/0061343 A1    Mar. 2, 2023

(51) Int. Cl.
| | |
|---|---|
| G11C 29/02 | (2006.01) |
| H01L 23/525 | (2006.01) |
| G11C 17/16 | (2006.01) |
| H01L 23/48 | (2006.01) |
| H10B 20/20 | (2023.01) |

(52) U.S. Cl.
CPC ......... *H01L 23/5256* (2013.01); *G11C 17/16* (2013.01); *H01L 23/481* (2013.01); *H10B 20/20* (2023.02); *G11C 29/027* (2013.01)

(58) Field of Classification Search
CPC .................................................... G11C 29/027
See application file for complete search history.

(56) References Cited

U.S. PATENT DOCUMENTS

| | | |
|---|---|---|
| 7,260,442 B2 | 8/2007 | Hwang et al. |
| 9,256,709 B2 | 2/2016 | Yu et al. |
| 2014/0040838 A1 | 2/2014 | Liu et al. |
| 2015/0278429 A1 | 10/2015 | Chang |
| 2017/0372791 A1* | 12/2017 | Hatsuda ............... G11C 29/027 |

* cited by examiner

*Primary Examiner* — Jason Lappas
(74) *Attorney, Agent, or Firm* — Hautpman Ham, LLP

(57) ABSTRACT

An integrated circuit includes a front-side horizontal conducting line in a first metal layer, a front-side vertical conducting line in a second metal layer, a front-side fuse element, and a backside conducting line. The front-side horizontal conducting line is directly connected to the drain terminal-conductor of a transistor through a front-side terminal via-connector. The front-side vertical conducting line is directly connected to the front-side horizontal conducting line through a front-side metal-to-metal via-connector. The front-side fuse element having a first fuse terminal conductively connected to the front-side vertical conducting line. The backside conducting line is directly connected to the source terminal-conductor of the transistor through a backside terminal via-connector.

20 Claims, 27 Drawing Sheets

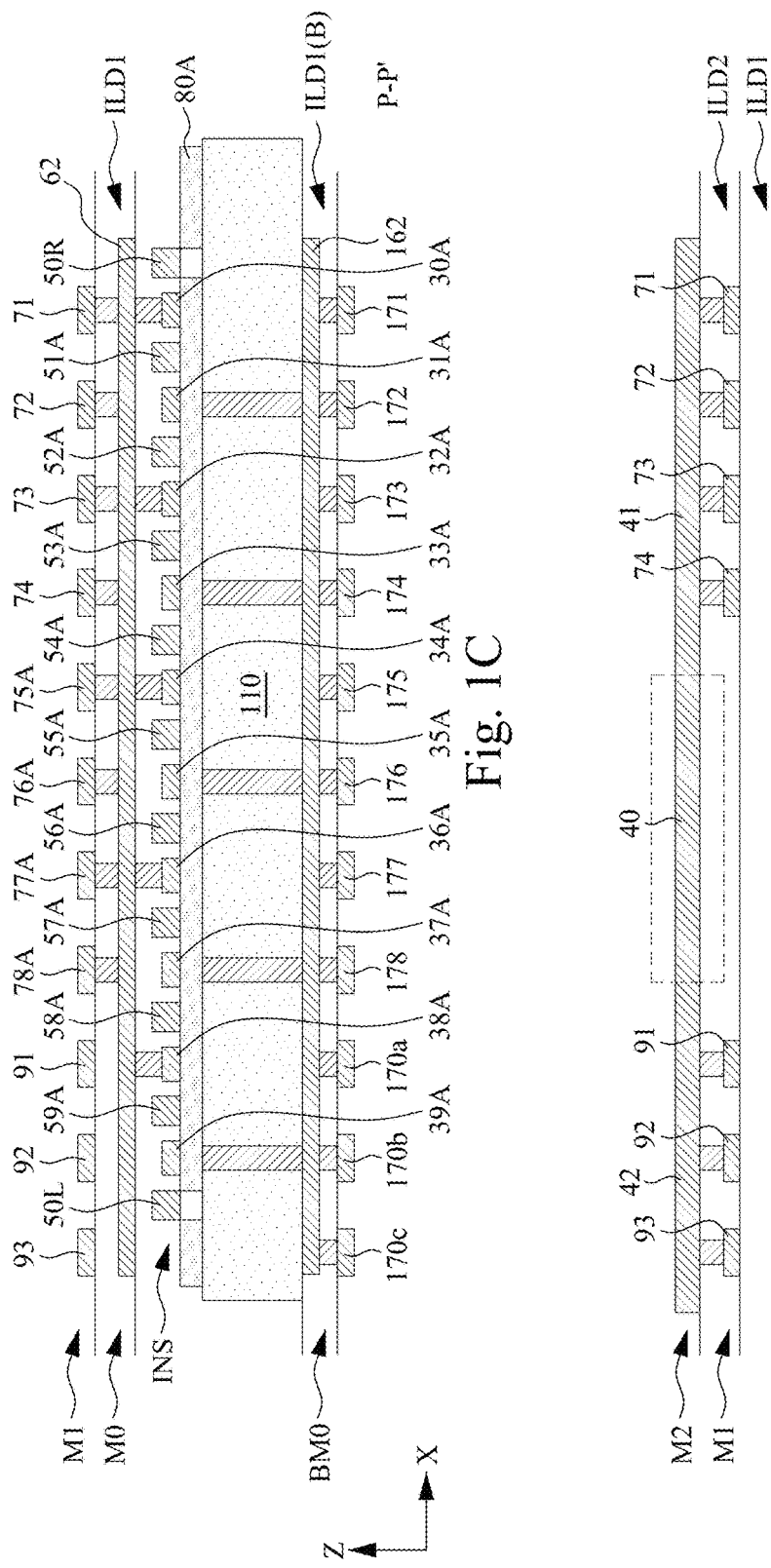
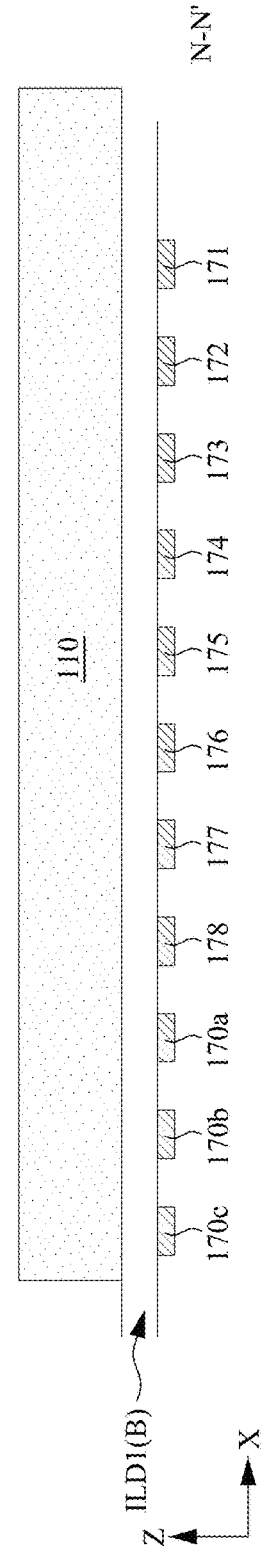
Fig. 1C
Fig. 1D

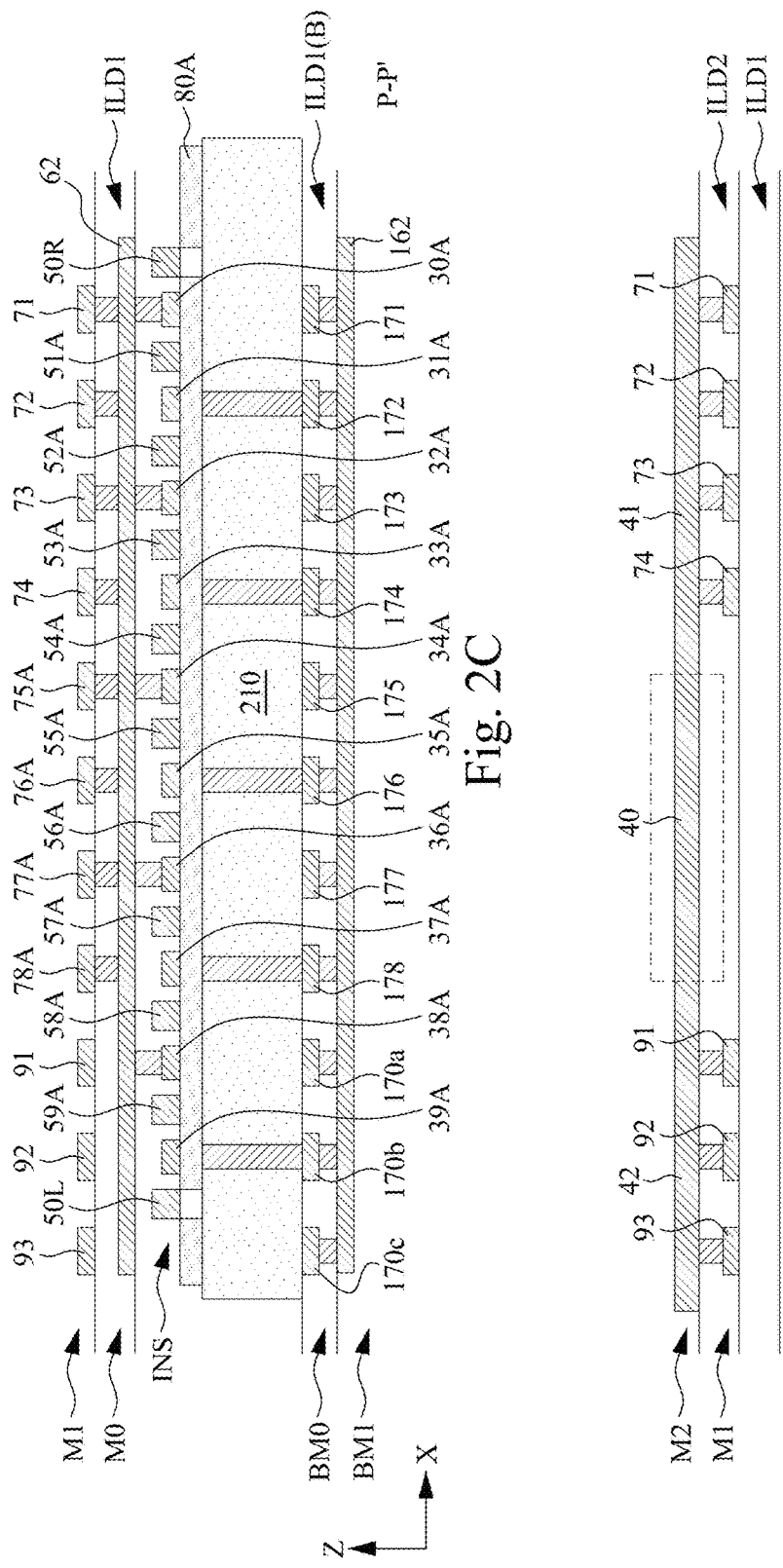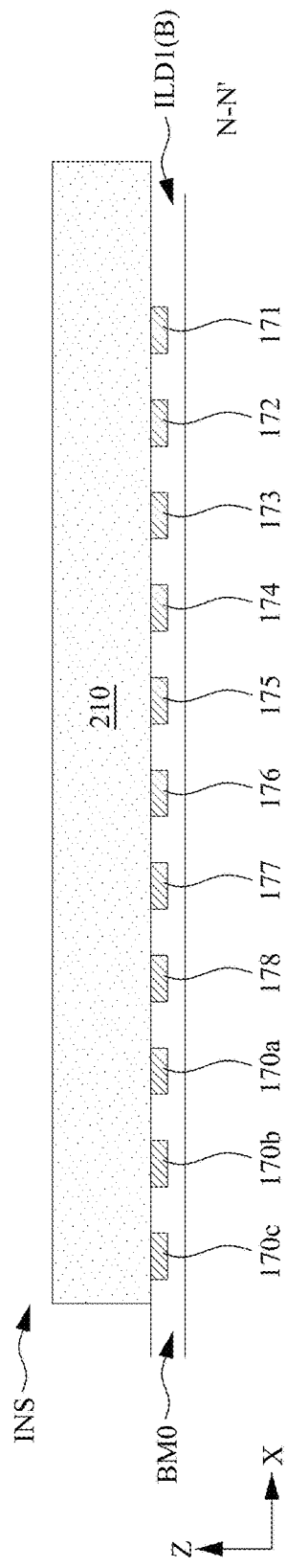
Fig. 2C
Fig. 2D

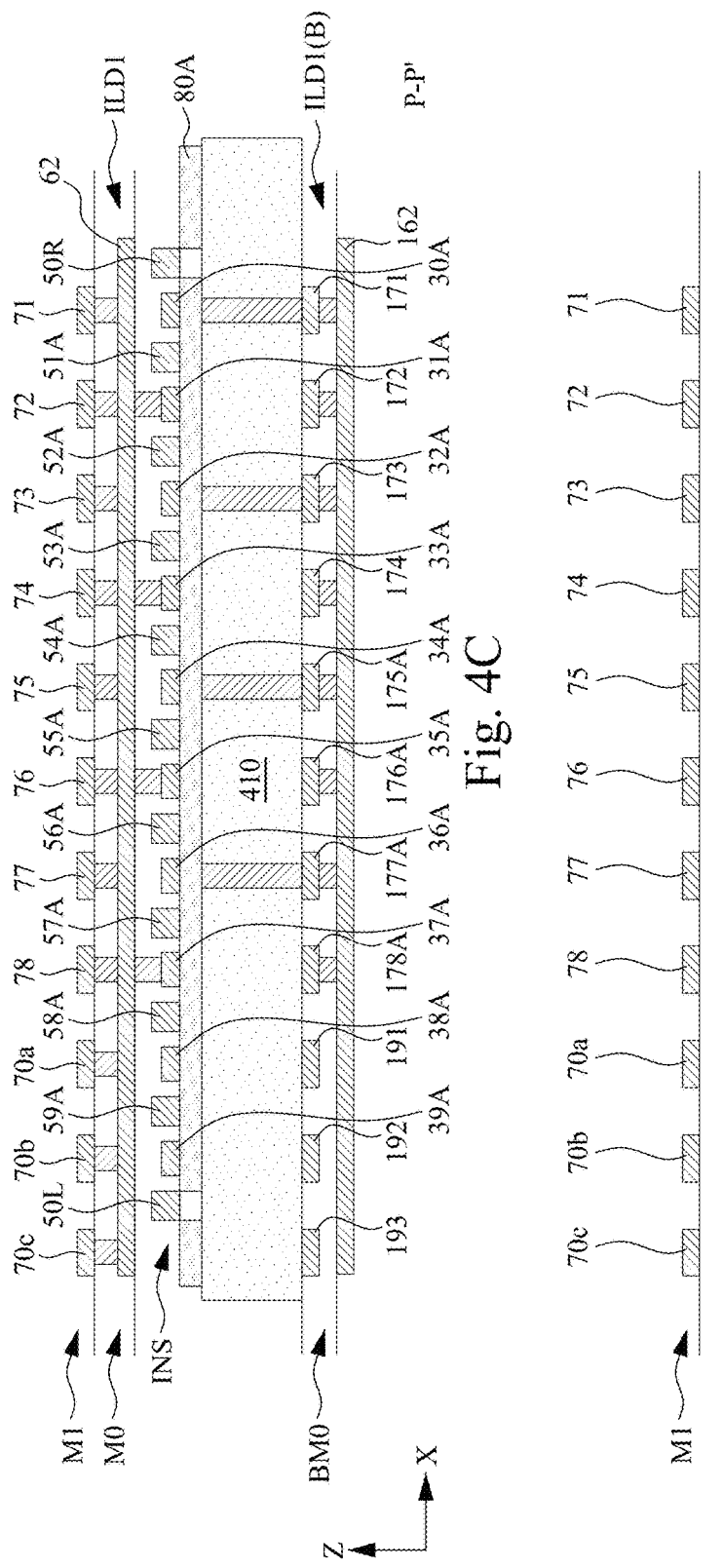
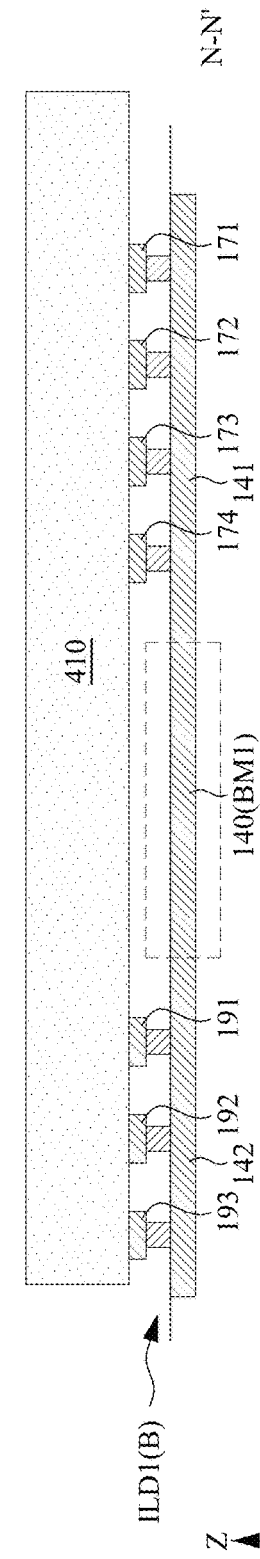
Fig. 4C
Fig. 4D

ELECTRICAL FUSE BIT CELL IN INTEGRATED CIRCUIT HAVING BACKSIDE CONDUCTING LINES

BACKGROUND

Integrated circuits (ICs) sometimes include one-time-programmable ("OTP") memory elements to provide non-volatile memory ("NVM") in which data are not lost when the IC is powered off. One type of NVM includes an electrical fuse (eFuse) integrated into an IC by using a narrow stripe (also called a "link") of conductive material (metal, polysilicon, or the like) connected to other circuit elements at each end. To program an eFuse, a programming current is applied to destructively alter (i.e., fuse) the link, thus increasing the resistance of the eFuse. Typically, to determine the status of an eFuse, a sense circuit is applied to the link and a comparison is made to a reference resistive device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1C-1D are cross-sectional views of the efuse bit cell in FIGS. 1A-1B and FIG. 7, in accordance with some embodiments.

FIGS. 2C-2D are cross-sectional views of the efuse bit cell in FIGS. 2A-2B and FIG. 7, in accordance with some embodiments.

FIGS. 4C-4D are cross-sectional views of the efuse bit cell in FIGS. 4A-4B and FIG. 7, in accordance with some embodiments.

DETAILED DESCRIPTION

Figure 1A:
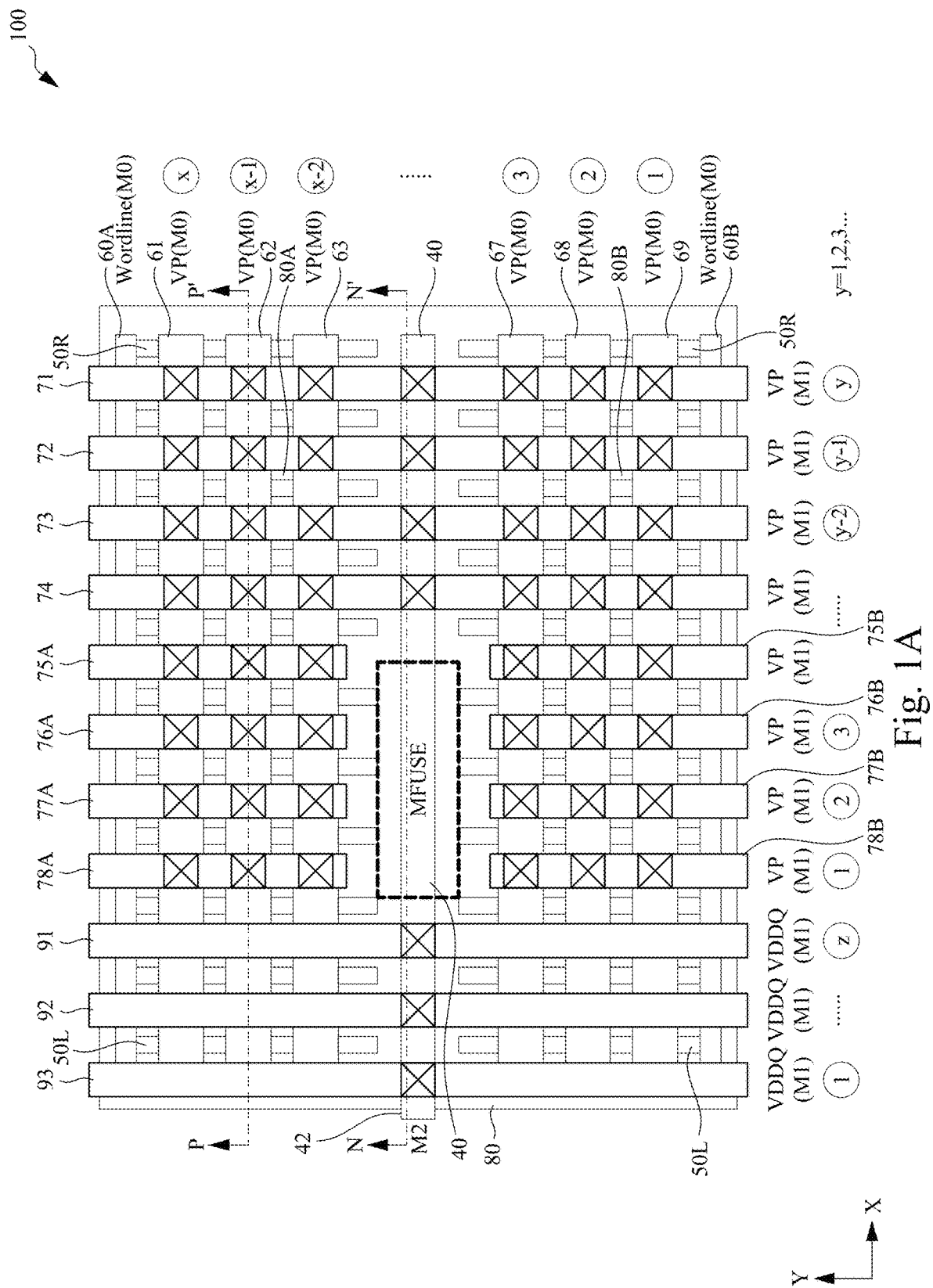
FIGS. 1A-1B are layout diagrams of an efuse bit cell, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an efuse bit cell in an integrated circuit includes a fuse element at the front-side of the substrate or at the backside of the substrate. The efuse bit cell also includes a transistor having a source terminal connected to a power node and having a drain terminal connected to the fuse element at an efuse node. The efuse bit cell further includes a front-side mesh structure and a backside mesh structure. Each of the front-side mesh structure and the backside mesh structure is either the power node or the efuse node. The front-side mesh structure includes front-side horizontal conducting lines in one front-side metal layer and front-side vertical conducting lines in another front-side metal layer. The backside mesh structure includes backside horizontal conducting lines in one backside metal layer and backside vertical conducting lines in another backside metal layer. The IR drop of the power node or the efuse node is reduced, when the line widths of the conducting lines in the corresponding mesh structure are increased.

In some embodiments, when backside conducting lines are available for forming the backside mesh structure, the IR drop in an efuse bit cell is smaller than the IR drop in some alternative implementations in which backside conducting lines are not available. Reducing the IR drop improves the reliability of the efuse bit cell and the reliability of an integrated circuit having many efuse bit cells. Additionally, in some embodiments, when the fuse elements in the efuse bit cells of an integrated circuit is at the backside of the substrate, the information stored in the efuse bit cells having the backside fuse elements is generally more secure than the information stored in some alternative implementations in which the fuse elements in the efuse bit cells are at the front-side of the substrate.

Figure 1B:
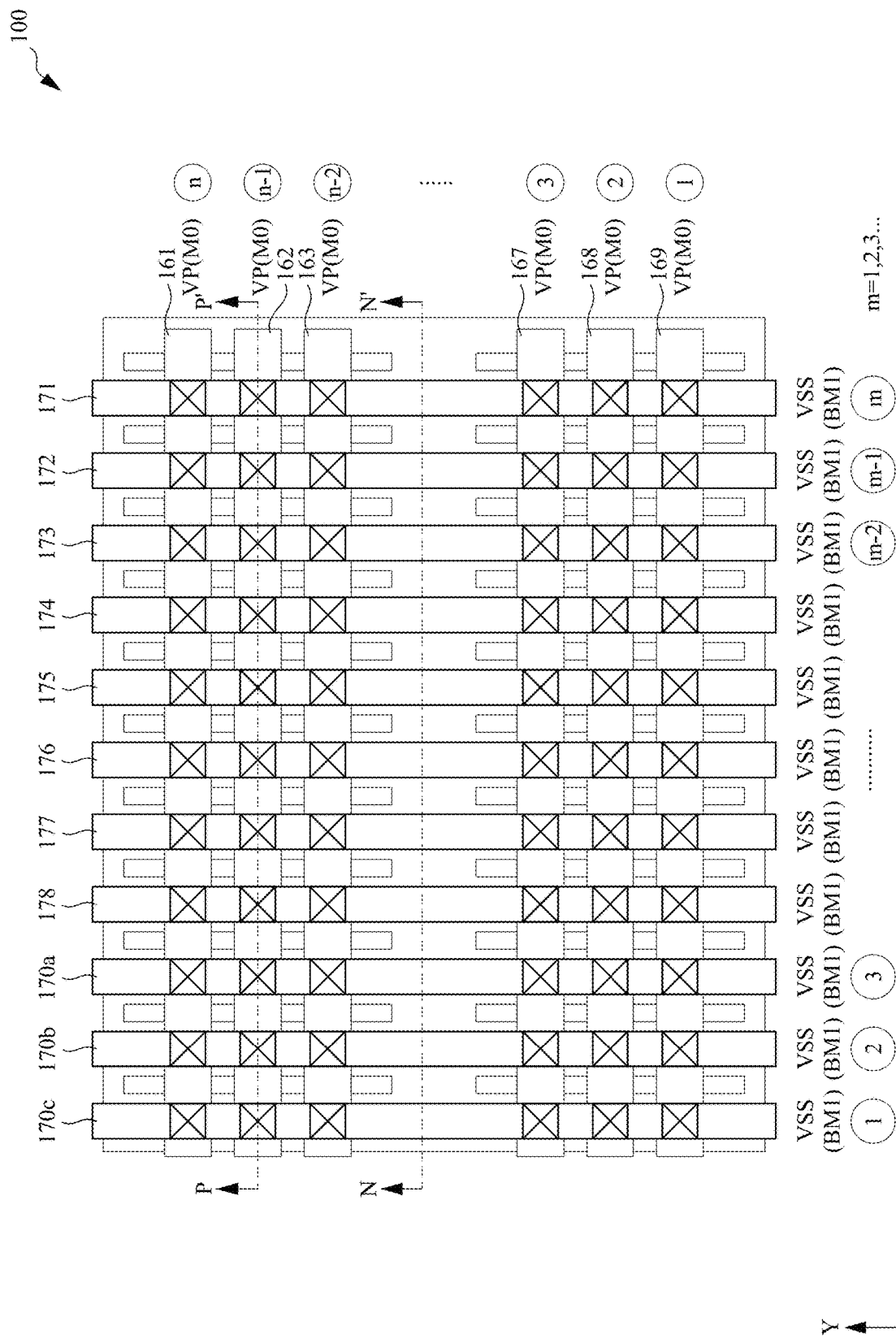
Figure 7:
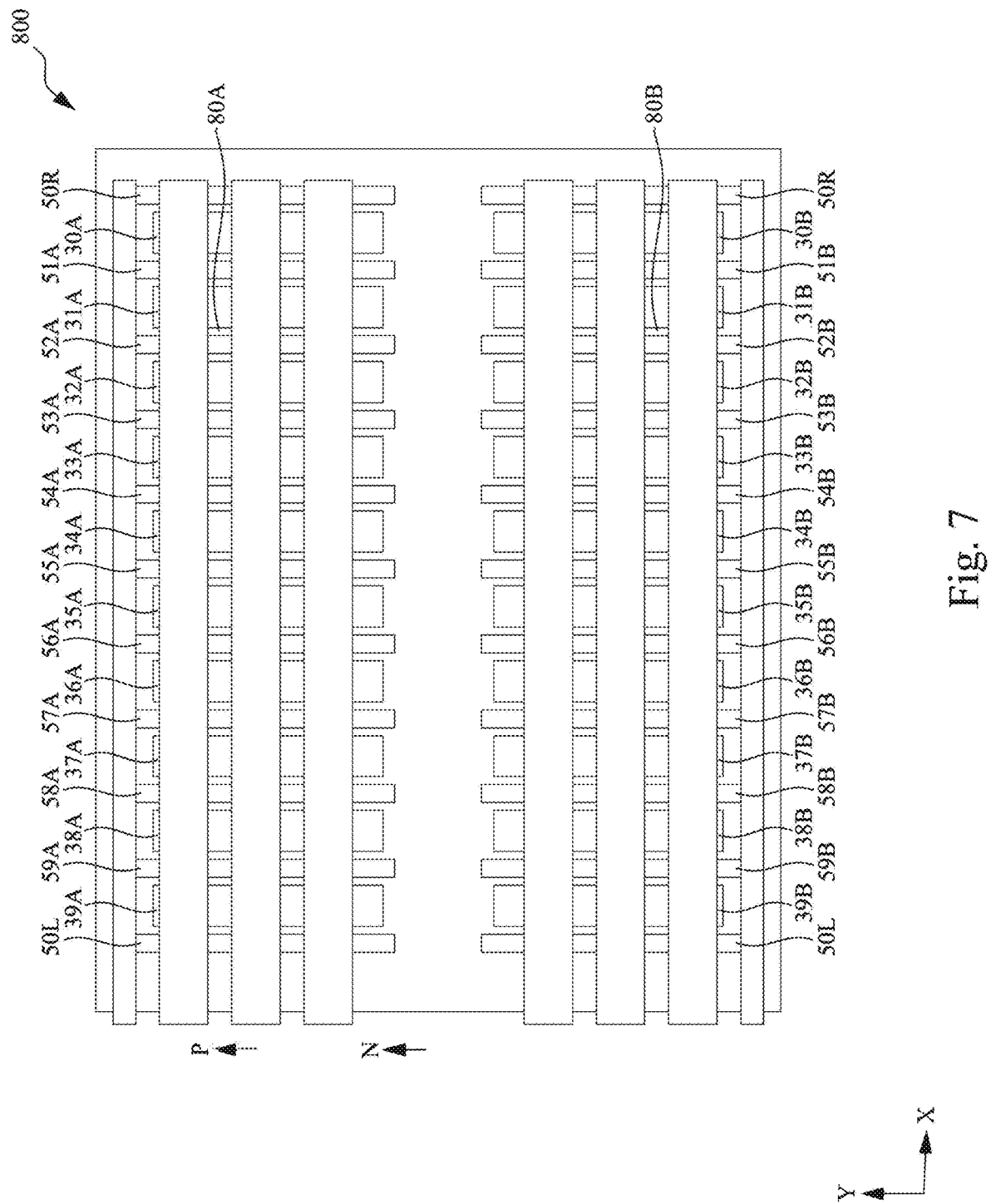
FIG. 7 is a layout design for the connections of the transistors in some efuse bit cells, in accordance with some embodiments.
Figure 8A:
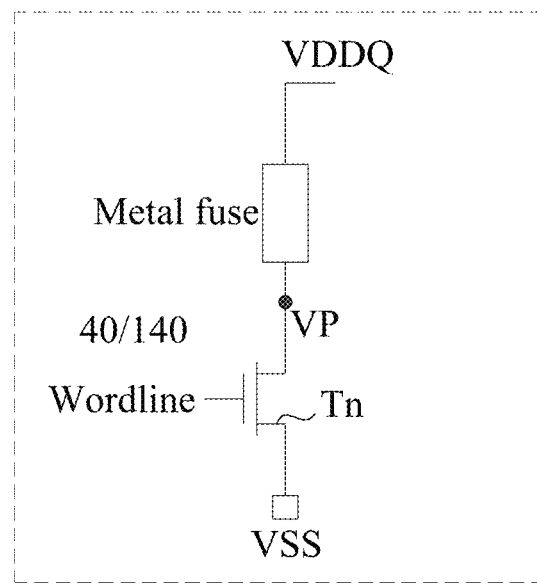
FIGS. 8A-8B are the equivalent circuits of some efuse bit cells as disclosed, in accordance with some embodiments.

FIGS. 1A-1B are layout diagrams of an efuse bit cell 100, in accordance with some embodiments. The layout diagram in FIG. 1A includes the layout designs for first and second metal layers at the front-side of the substrate 110, and the layout diagram in FIG. 1B includes the layout designs for first and second backside metal layers at the backside of the substrate 110. FIG. 7 is a layout design for the connections of the transistors in some efuse bit cells (such as, the efuse bit cell 100), in accordance with some embodiments. FIG. 1C is the cross-sectional view of the efuse bit cell in a cutting plane P-P' as specified in FIGS. 1A-1B and FIG. 7, in accordance with some embodiments. FIG. 1D is the cross-sectional view of the efuse bit cell 100 in a cutting plane N-N' as specified in FIGS. 1A-1B and FIG. 7, in accordance with some embodiments. The equivalent circuit of the efuse bit cell 100 is shown in FIG. 8A.

As shown in FIG. 7 and FIGS. 1C-1D, the efuse bit cell 100 includes semiconductor structures 80A and 80B on the substrate 110. Each of the semiconductor structures 80A and 80B extends in the X-direction within an active zone. The efuse bit cell 100 includes gate-conductors (51A-59A and 51B-59B in FIG. 7) extending in the Y-direction. Here, the Y-direction is perpendicular to the X-direction. Each of the gate-conductors 51A-59A intersects the semiconductor structure 80A at a corresponding channel region, and each of the gate-conductors 51B-59B intersects the semiconductor structure 80B at a corresponding channel region. The efuse bit cell 100 includes terminal-conductors (30A-39A and 30B-39B) extending in the Y-direction. Each of the terminal-conductors 30A-39A intersects the semiconductor structure 80A at a corresponding source/drain region, and each of the terminal-conductors 30B-39B intersects the semiconductor structure 80B at a corresponding source/drain region. In some embodiments, when the semiconductor structures 80A and 80B are fin structures, the transistors formed in the semiconductor structures are FinFETs. In some embodiments, when the semiconductor structures 80A and 80B are nano-sheet structures, the transistors formed in the semiconductor structures are nano-sheet transistors. In some embodiments, when the semiconductor structures 80A and 80B are nano-wire structures, the transistors formed in the semiconductor structures are nano-wire transistors.

In FIG. 7 and FIGS. 1C-1D, the isolation regions under the dummy gate-conductors (50L and 50R) in the semiconductor structures (80A and 80B) at the vertical boundaries of the cell are provided for cell isolation. Specifically, the isolation regions isolate the active regions (such as source regions, drain regions, and channel regions) in the efuse bit cell 100 from other active regions in adjacent cells.

In FIG. 1A and FIGS. 1C-1D, the efuse bit cell 100 includes front-side horizontal conducting lines (61-63 and 67-69) extending in the X-direction in the first metal layer M0. The efuse bit cell 100 includes word connection lines (60A and 60B) extending in the X-direction in the first metal layer M0. The first metal layer M0 is on insulation materials INS above the gate-conductors (51A-59A and 51B-59B) and the terminal-conductors (30A-39A and 30A-39A). Each of the front-side horizontal conducting lines 61-63 is directly connected to the drain terminal-conductors 30A, 32A, 34A, 36A, and 38A through the corresponding front-side terminal via-connectors VD. Each of the front-side horizontal conducting lines 67-69 is directly connected to the drain terminal-conductors 30B, 32B, 34B, 36B, and 38B through the corresponding front-side terminal via-connectors VD. The word connection line 60A is directly connected to the gate-conductors (51A-59A) through the corresponding front-side gate via-connectors VG. The word connection line 60B is directly connected to the gate-conductors (51B-59B) through the corresponding front-side gate via-connectors VG.

In FIG. 1A and FIGS. 1C-1D, the efuse bit cell 100 includes front-side vertical conducting lines (71-74, 75A-78A, and 75B-78B) extending in the Y-direction in the second metal layer M1. The efuse bit cell 100 also includes bit connection lines 91-93 extending in the Y-direction in the second metal layer M1. The second metal layer M1 is above the first metal layer M0 and is separated from the first metal layer M0 by a layer of inter-layer dielectric ILD1. Each of the front-side vertical conducting lines 71-74 is directly connected to the front-side horizontal conducting lines 61-63 and 67-69 through the corresponding front-side metal-to-metal via-connectors V0. Each of the front-side vertical conducting lines 75A-78A is directly connected to the front-side horizontal conducting lines 61-63 through the corresponding front-side metal-to-metal via-connectors V0. Each of the front-side vertical conducting lines 75B-78B is directly connected to the front-side horizontal conducting lines 67-69 through the corresponding front-side metal-to-metal via-connectors V0. The front-side metal-to-metal via-connector V0 is a via connector that passes through the inter-layer dielectric ILD1 between the two metal layers (M0 and M1) while connecting a conducting line in the first metal layer M0 with a conducting line in the second metal layer M1.

In FIG. 1A and FIGS. 1C-1D, the efuse bit cell 100 includes a fuse element 40 having a first fuse terminal 41 and a second fuse terminal 42. In some embodiments, the fuse element 40 is a metal fuse. When a current larger than a threshold value passes through the metal fuse, the metal fuse will be broken, and the resistance value between the two fuse terminals will change from a low resistance value to a high resistance value. In some embodiments, each of the first fuse terminal 41, the fuse element 40, and the second fuse terminal 42 is formed in a part of a metal line extending in the X-direction in the third metal layer M2. The third metal layer M2 is above the second metal layer M1 and is separated from the second metal layer M1 by a layer of inter-layer dielectric ILD2. In FIG. 1A and FIGS. 1C-1D, the first fuse terminal 41 is conductively connected to each of the front-side vertical conducting lines 71-74 through a corresponding front-side via-one connector V1. The second fuse terminal 42 is conductively connected to each of the bit connection lines 91-93 through a corresponding front-side via-one connector V1. The front-side via-one connector V1 is a via connector that passes through the inter-layer dielectric ILD2 between the two metal layers (M1 and M2) while connecting a conducting line in the third metal layer M2 with a conducting line in the second metal layer M1.

In FIG. 1A and FIGS. 1C-1D, each of the first fuse terminal 41, the fuse element 40, and the second fuse terminal 42 is in the same third metal layer M2. In some alternative embodiments, the first fuse terminal 41, the fuse element 40, and the second fuse terminal 42 are in the different third metal layers. For example, in some alternative embodiments, each of the first fuse terminal 41 and the second fuse terminal 42 is in the third metal layer M2, while the fuse element 40 is a metal fuse in the fifth metal layer M4, and the fuse element 40 is connected to the fuse terminals through various via connectors. In some alternative embodiments, each of the first fuse terminal 41 and the fuse element 40 is in the third metal layer M2, while the second fuse terminal 42 in the fifth metal layer M4, and the fuse element 40 is connected to the second fuse terminal 42 through various via connectors. A metal fuse is an example of an efuse for using as the fuse element 40. Other types of efuse for use as the fuse element 40 are within the contemplated scope of the present disclosure.

In FIG. 1B and FIGS. 1C-1D, the efuse bit cell 100 includes backside horizontal conducting lines (161-163 and 167-169) extending in the X-direction in the first backside metal layer BM0. In FIGS. 1C-1D, the first backside metal layer BM0 is supported by the substrate 110. Each of the backside horizontal conducting lines 161-163 is directly connected to the source terminal-conductors 31A, 33A, 35A, 37A, and 39A through a corresponding backside terminal via-connector BVD. Each of the backside horizontal conducting lines 167-169 is directly connected to the source terminal-conductors 31B, 33B, 35B, 37B, and 39B through the corresponding backside terminal via-connectors BVD.

In FIG. 1B and FIGS. 1C-1D, the efuse bit cell 100 includes backside vertical conducting lines (171-178 and 170a-170c) extending in the Y-direction in the second backside metal layer BM1. The second backside metal layer BM1 is separated from the first backside metal layer BM0 by a layer of backside inter-layer dielectric ILD1(B). Each of the backside vertical conducting lines (171-178 and 170a-170c) is directly connected to the backside horizontal conducting lines (161-163 and 167-169) through the corresponding backside metal-to-metal via-connectors BV0. The interconnected mesh structure of the backside horizontal conducting lines and the backside vertical conducting lines forms a power node for the efuse bit cell 100. The backside metal-to-metal via-connectors BV0 is a via connector that passes through the inter-layer dielectric ILD1 between the two metal layers (BM0 and BM1) while connecting a conducting line in the first backside metal layer BM0 with a conducting line in the second backside metal layer BM1.

In FIGS. 1A-1B, a mesh structure for the efuse node VP is formed at the front-side of the substrate 110 by interconnecting the front-side horizontal conducting lines with the front-side vertical conducting lines. A mesh structure for the power node is formed at the backside of the substrate 110 by interconnecting the backside horizontal conducting lines with the backside vertical conducting lines. In some embodiments, when the transistors in the semiconductor structures 80A and 80B are n-channel transistors, the equivalent circuit of the efuse bit cell 100 is shown in FIG. 8A. The power node for the efuse bit cell 100 is configured to receive the supply voltage VSS. The first fuse terminal 41 of the fuse element 40 is connected to the efuse node VP. The second fuse terminal 42 of the fuse element 40 is connected to the bit node VDDQ.

Figure 2A:
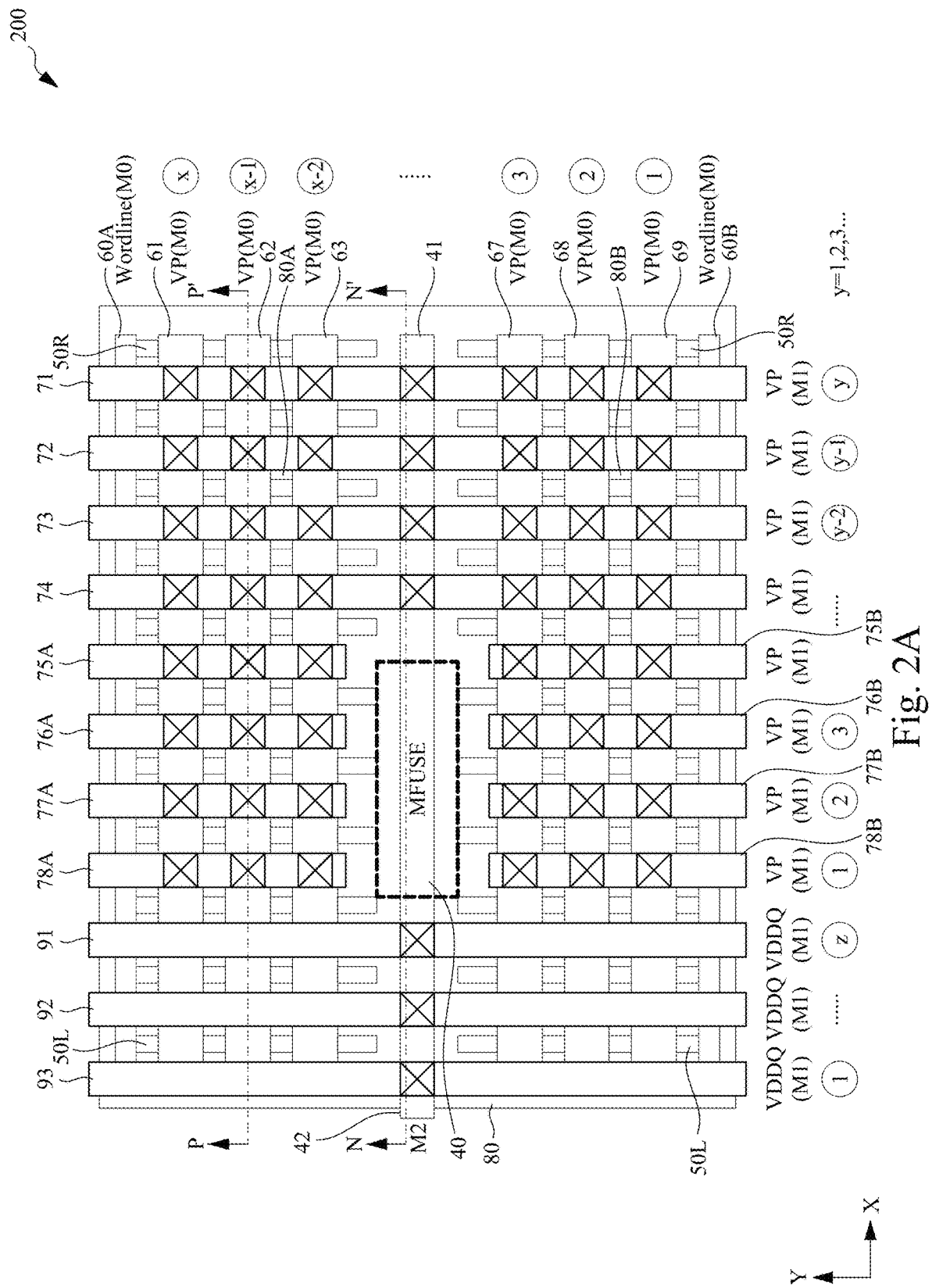
FIGS. 2A-2B are layout diagrams of an efuse bit cell, in accordance with some embodiments.
Figure 2B:
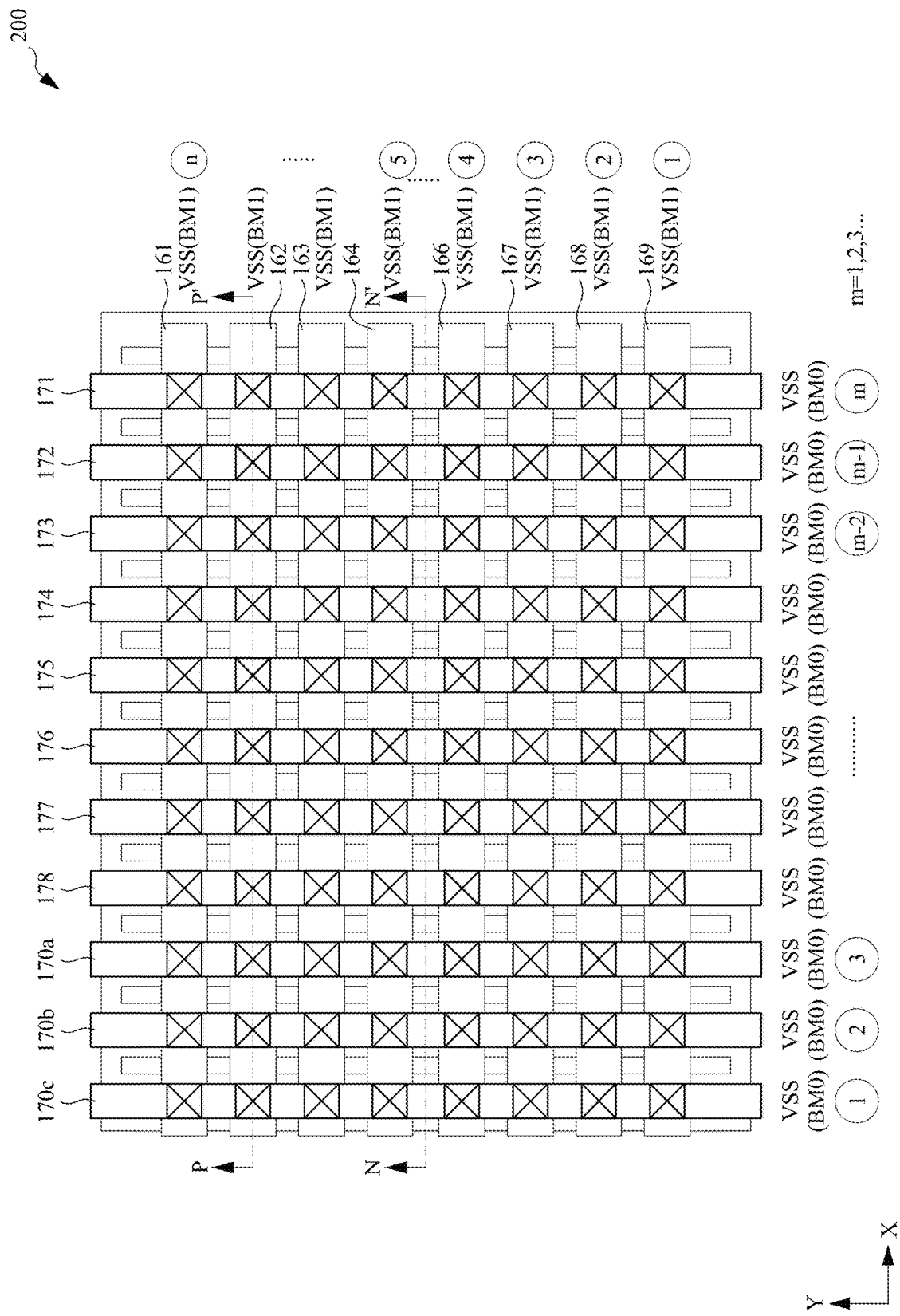

FIGS. 2A-2B are layout diagrams of an efuse bit cell 200, in accordance with some embodiments. The layout diagram in FIG. 2A includes the layout designs for first and second metal layers at the front-side of the substrate 210, and the layout diagram in FIG. 2B includes the layout designs for first and second backside metal layers at the backside of the substrate 210. The layout design for the connections of the transistors in the efuse bit cell 200 is specified by FIG. 7. FIG. 2C is the cross-sectional view of the efuse bit cell in a cutting plane P-P' as specified in FIGS. 2A-2B and FIG. 7, in accordance with some embodiments. FIG. 2D is the cross-sectional view of the efuse bit cell 200 in a cutting plane N-N' as specified in FIGS. 2A-2B and FIG. 7, in accordance with some embodiments. The equivalent circuit of the efuse bit cell 200 is shown in FIG. 8A.

The layout designs of the elements in the efuse bit cell 200 at the front-side of the substrate 210 (as specified by in FIG. 2A and FIG. 7) is identical to the layout designs of the elements in the efuse bit cell 100 at the front-side of the substrate 110 (as specified by the layout designs in FIG. 1A and FIG. 7). The common elements at the front-side of the substrates (110 and 210) includes the semiconductor structures (80A and 80B), the gate-conductors (51A-59A and 51B-59B), the terminal-conductors (30A-39A and 30B-39B), and the dummy gate-conductors (50L and 50R). The common elements at the front-side of the substrates (110 and 210) also includes the front-side horizontal conducting lines (61-63 and 67-69), the word connection lines (60A and 60B), the front-side vertical conducting lines (71-74, 75A-78A, and 75B-78B), the bit connection lines 91-93, the fuse element 40 having the fuse terminals 41 and 42, and various front-side via connectors.

The layout designs of the elements in the efuse bit cell 200 at the backside of the substrate 210 are depicted in FIG. 2B. The layout designs in FIG. 2B is different from the layout designs in FIG. 1B with respect to the orientations of the backside conducting lines in the first and the second backside metal layers. The backside horizontal conducting lines (161-163 and 167-169) in FIG. 2B are in the second backside metal layer BM1, whereas the backside horizontal conducting lines (161-163 and 167-169) in FIG. 1B are in the first backside metal layer BM0. The vertical conducting lines (171-178 and 170a-170c) in FIG. 2B are in the first backside metal layer BM0, whereas the vertical conducting lines (171-178 and 170a-170c) in FIG. 1B are in the second backside metal layer BM1.

Furthermore, in FIG. 2B and FIGS. 2C-2D, each of the backside vertical conducting lines 172, 174, 176, 178 and 170b is correspondingly connected to one of the source terminal-conductors 31A, 33A, 35A, 37A, and 39A through a corresponding backside terminal via-connectors BVD. Each of the backside vertical conducting lines 172, 174, 176, 178 and 170b is also correspondingly connected to one of the source terminal-conductors 31B, 33B, 35B, 37B, and 39B through a corresponding backside terminal via-connectors BVD. For example, the backside vertical conducting line 172 is directly connected to one of the source terminal-conductors 31A and 31B through a corresponding backside terminal via-connectors BVD. Additionally, each of the backside vertical conducting lines (171-178 and 170a-170c) is directly connected to the backside horizontal conducting lines (161-163 and 167-169) through the corresponding backside metal-to-metal via-connectors BV0.

In FIGS. 2A-2B, a mesh structure for the efuse node VP is formed at the front-side of the substrate 210 by interconnecting the front-side horizontal conducting lines with the front-side vertical conducting lines. A mesh structure for the power node is formed at the backside of the substrate 210 by interconnecting the backside horizontal conducting lines with the backside vertical conducting lines. In some embodiments, when the transistors in the semiconductor structures 80A and 80B are n-channel transistors, the equivalent circuit of the efuse bit cell 200 is shown in FIG. 8A. The power node for the efuse bit cell 200 is configured to receive the supply voltage VSS. The first fuse terminal 41 of the fuse element 40 is connected to the efuse node VP. The second fuse terminal 42 of the fuse element 40 is connected to the bit node VDDQ.

Figure 3A:
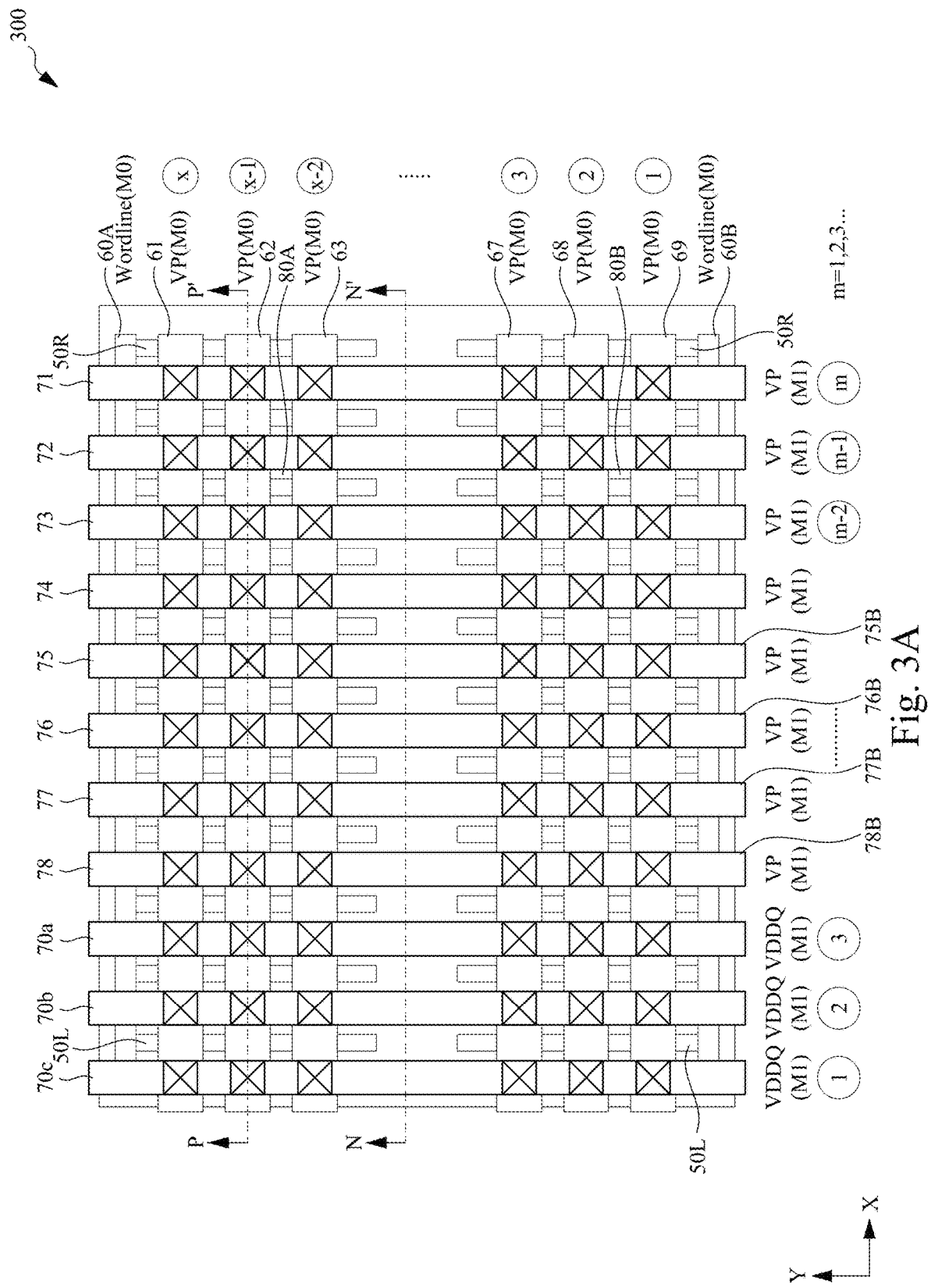
FIGS. 3A-3B are layout diagrams of an efuse bit cell, in accordance with some embodiments.
Figure 3B:
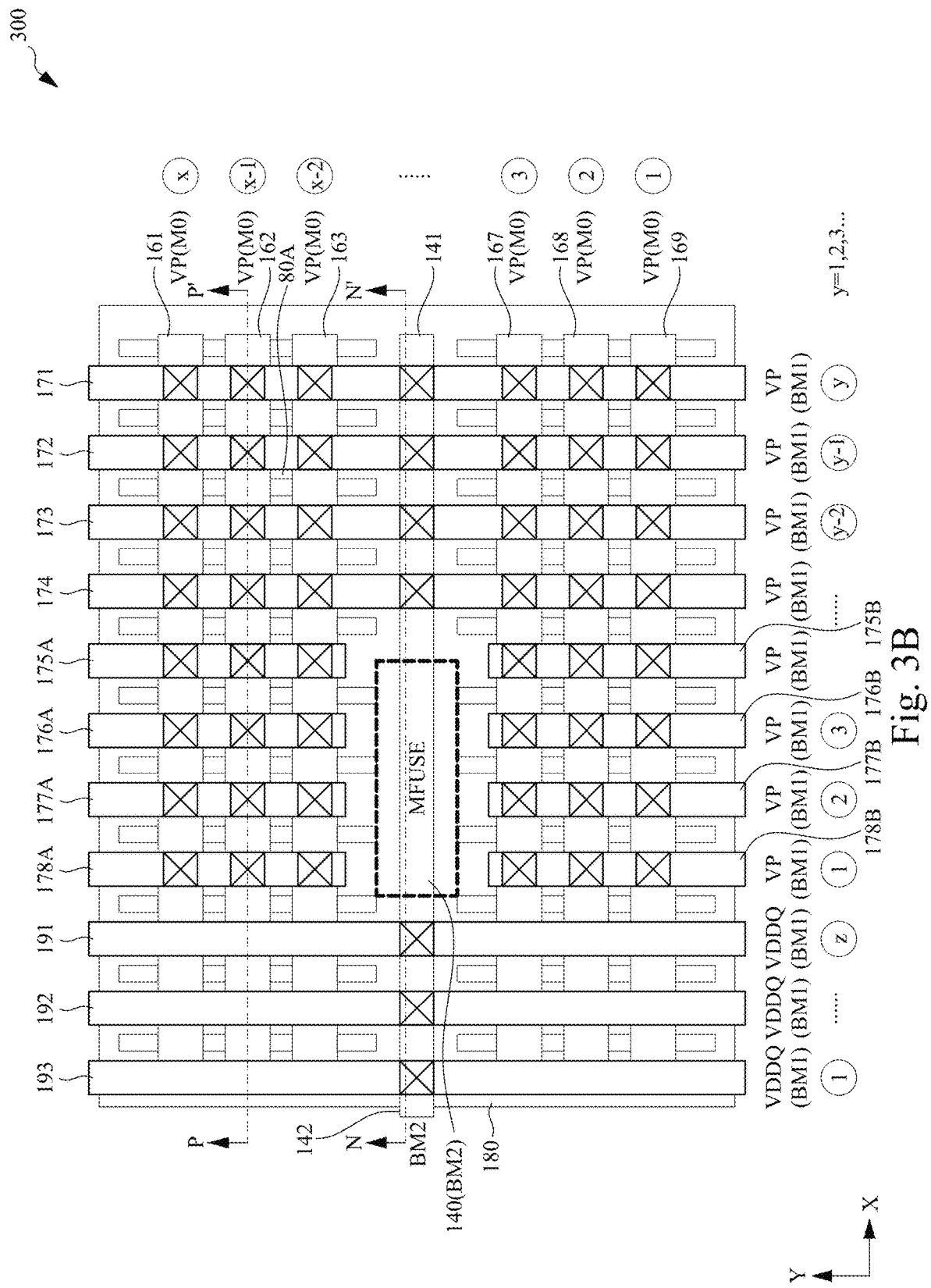
Figure 3C:
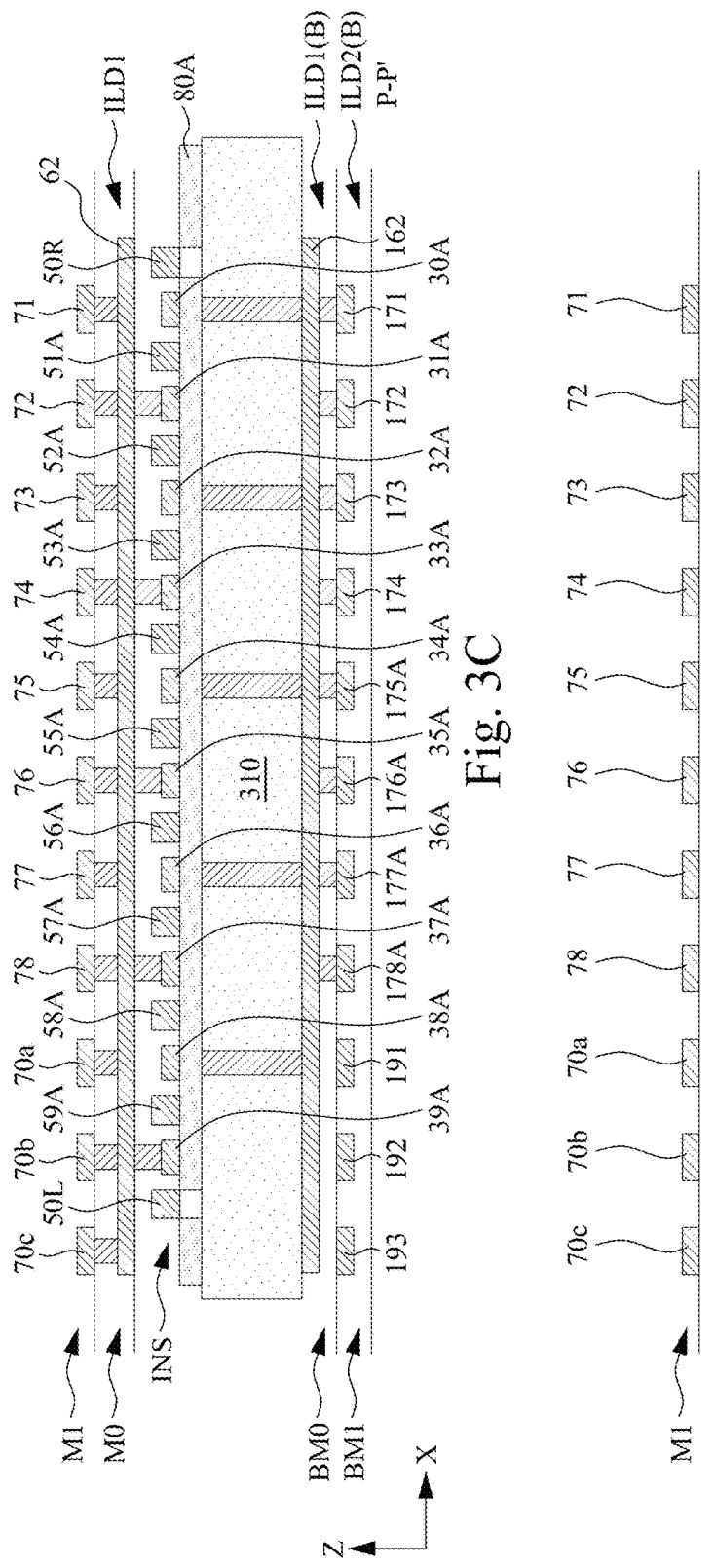
FIGS. 3C-3D are cross-sectional views of the efuse bit cell in FIGS. 3A-3B and FIG. 7, in accordance with some embodiments.
Figure 3D:
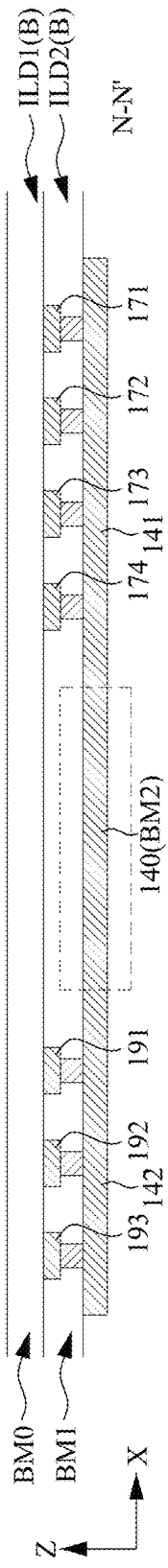

FIGS. 3A-3B are layout diagrams of an efuse bit cell 300, in accordance with some embodiments. The layout diagram in FIG. 3A includes the layout designs for first and second metal layers at the front-side of the substrate 310, and the layout diagram in FIG. 3B includes the layout designs for first and second backside metal layers at the backside of the substrate 310. The layout design for the connections of the transistors in the efuse bit cell 300 is specified by FIG. 7. FIG. 3C is the cross-sectional view of the efuse bit cell in a cutting plane P-P' as specified in FIGS. 3A-3B and FIG. 7, in accordance with some embodiments. FIG. 3D is the cross-sectional view of the efuse bit cell 300 in a cutting plane N-N' as specified in FIGS. 3A-3B and FIG. 7, in accordance with some embodiments. The equivalent circuit of the efuse bit cell 300 is shown in FIG. 8A.

In FIG. 3A and FIGS. 3C-3D, the efuse bit cell 300 includes front-side horizontal conducting lines (61-63 and 67-69) extending in the X-direction in the first metal layer M0. The efuse bit cell 300 includes word connection lines (60A and 60B) extending in the X-direction in the first metal layer M0. The first metal layer M0 is above the gate-conductors (51A-59A and 51B-59B) and the terminal-conductors (30A-39A and 30A-39A). Each of the front-side horizontal conducting lines 61-63 is directly connected to the source terminal-conductors 31A, 33A, 35A, 37A, and 39A through the corresponding front-side terminal via-connectors VD. Each of the front-side horizontal conducting lines 67-69 is directly connected to the source terminal-conductors 31B, 33B, 35B, 37B, and 39B through the corresponding front-side terminal via-connectors VD.

In FIG. 3A and FIGS. 3C-3D, the efuse bit cell 300 includes front-side vertical conducting lines (71-78 and 70a-70b) extending in the Y-direction in the second metal layer M1. Each of the front-side vertical conducting lines (71-78 and 70a-70b) is directly connected to the front-side horizontal conducting lines (61-63 and 67-69) through the corresponding front-side metal-to-metal via-connectors V0.

In FIG. 3B and FIGS. 3C-3D, the efuse bit cell 300 includes backside horizontal conducting lines (161-163 and 167-169) extending in the X-direction in the first backside metal layer BM0. In FIGS. 1C-1D, the first backside metal layer BM0 is supported by the substrate 310. Each of the backside horizontal conducting lines 161-163 is directly connected to the drain terminal-conductors 30A, 32A, 34A, 36A, and 38A through a corresponding backside terminal via-connector BVD. Each of the backside horizontal conducting lines 167-169 is directly connected to the drain terminal-conductors 30B, 32B, 34B, 36B, and 38B through the corresponding backside terminal via-connectors BVD.

In FIG. 3B and FIGS. 3C-3D, the efuse bit cell 300 includes backside vertical conducting lines (171-174, 175A-178A, and 175B-178B) extending in the Y-direction in the second backside metal layer BM1. The efuse bit cell 300 also includes backside bit connection lines 191-193 extending in the Y-direction in the second backside metal layer BM1. The second backside metal layer BM1 is separated from the first backside metal layer BM0 by a layer of backside inter-layer dielectric ILD1(B). Each of the backside vertical conducting lines 171-174 is directly connected to the backside horizontal conducting lines 161-163 and 167-169 through the corresponding backside metal-to-metal via-connectors BV0. Each of the backside vertical conducting lines 175A-178A is directly connected to the backside horizontal conducting lines 161-163 through the corresponding backside metal-to-metal via-connectors BV0. Each of the backside vertical conducting lines 175B-178B is directly connected to the backside horizontal conducting lines 167-169 through the corresponding backside metal-to-metal via-connectors BV0.

In FIG. 3B and FIGS. 3C-3D, the efuse bit cell 300 includes a backside fuse element 140(BM2) having a first fuse terminal 141 and a second fuse terminal 142. In some embodiments, the fuse element 140(BM2) is a metal fuse. Each of the first fuse terminal 141, the fuse element 140(BM2), and the second fuse terminal 142 is formed in a part of a metal line extending in the X-direction in the third backside metal layer BM2. The third backside metal layer BM2 is separated from the second metal layer BM1 by a layer of backside inter-layer dielectric ILD2(B). In FIG. 3B and FIGS. 3C-3D, the first fuse terminal 141 is conductively connected to each of the front-side vertical conducting lines 171-174 through a corresponding backside via-one connector BV1. The second fuse terminal 142 is conductively connected to each of the backside bit connection line 191-193 through a corresponding backside via-one connector BV1. The backside via-one connector BV1 is a via connector that passes through the inter-layer dielectric ILD2(B) between the two metal layers (BM1 and BM2) while connecting a conducting line in the third backside metal layer BM2 with a conducting line in the second backside metal layer BM1.

In FIG. 3B and FIGS. 3C-3D, each of the first fuse terminal 141, the fuse element 140(BM2), and the second fuse terminal 142 is formed in the same second backside metal layer BM2. In some alternative embodiments, the first fuse terminal 141, the fuse element 140(BM2), and the second fuse terminal 142 are in the different third metal layers. For example, in some alternative embodiments, each of the first fuse terminal 141 and the second fuse terminal 142 is in the third backside metal layer BM2, while the fuse element 140 is a metal fuse in the fifth backside metal layer BM4, and the fuse element 140 is connected to the fuse terminals through various via connectors. In some alternative embodiments, each of the first fuse terminal 141 and the fuse element 140(BM2) is in the third backside metal layer BM2, while the second fuse terminal 142 in in the fifth backside metal layer BM4, and the fuse element 140(BM2) is connected to the second fuse terminal 142 through various via connectors. A metal fuse is an example of an efuse for use as the fuse element. Other types of efuse for use as the fuse element are within the contemplated scope of the present disclosure.

In FIGS. 3A-3B, a mesh structure for the power node is formed at the front-side of the substrate 310 by interconnecting the front-side horizontal conducting lines with the front-side vertical conducting lines. A mesh structure for the efuse node VP is formed at the backside of the substrate 310 by interconnecting the backside horizontal conducting lines with the backside vertical conducting lines. In some embodiments, when the transistors in the semiconductor structures 80A and 80B are n-channel transistors, the equivalent circuit of the efuse bit cell 300 is shown in FIG. 8A. The power node for the efuse bit cell 300 is configured to receive the supply voltage VSS. The first fuse terminal 141 of the fuse element 140(BM2) is connected to the efuse node VP. The second fuse terminal 142 of the fuse element 140(BM2) is connected to the bit node VDDQ.

Figure 4A:
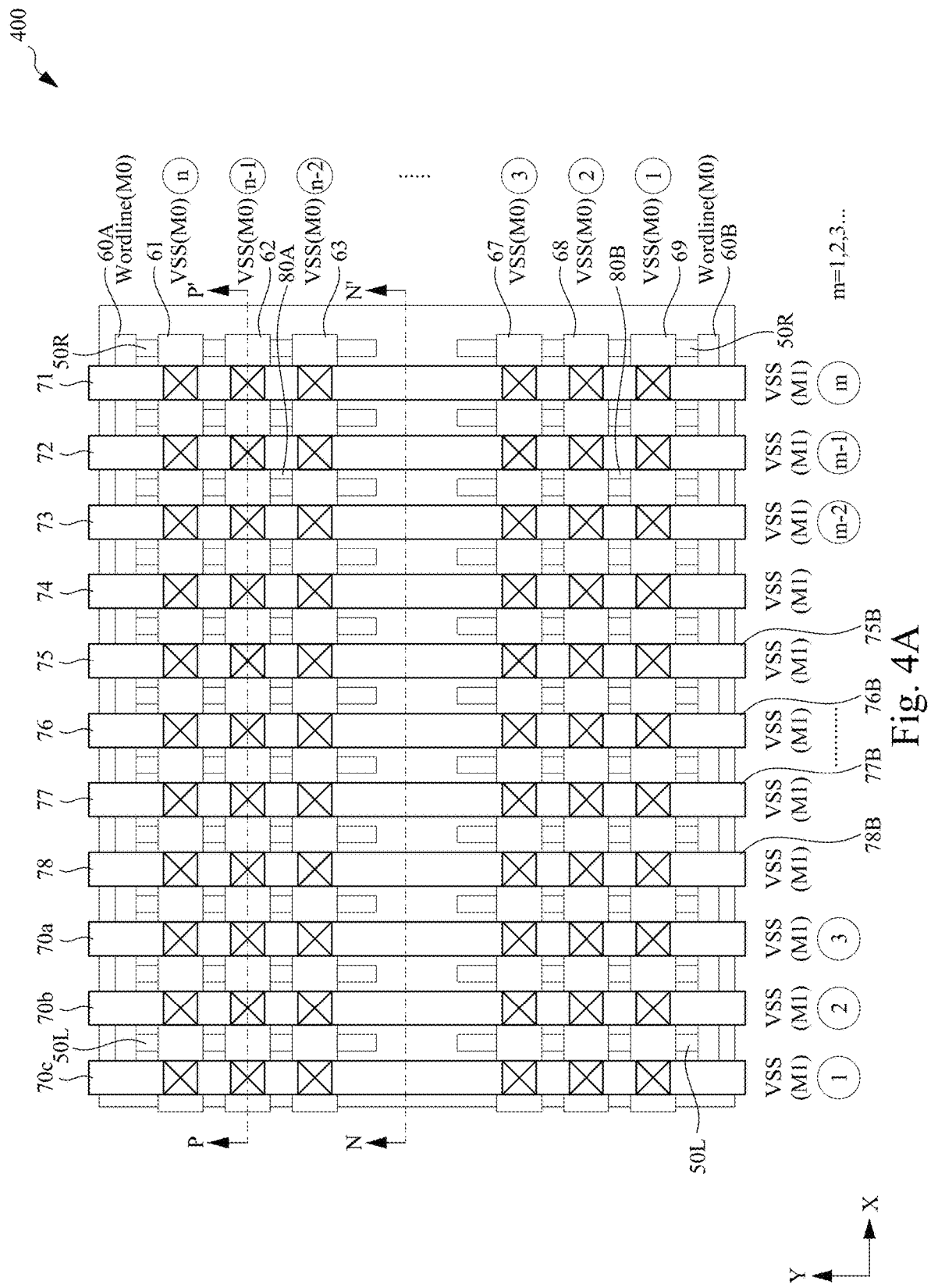
FIGS. 4A-4B are layout diagrams of an efuse bit cell, in accordance with some embodiments.
Figure 4B:
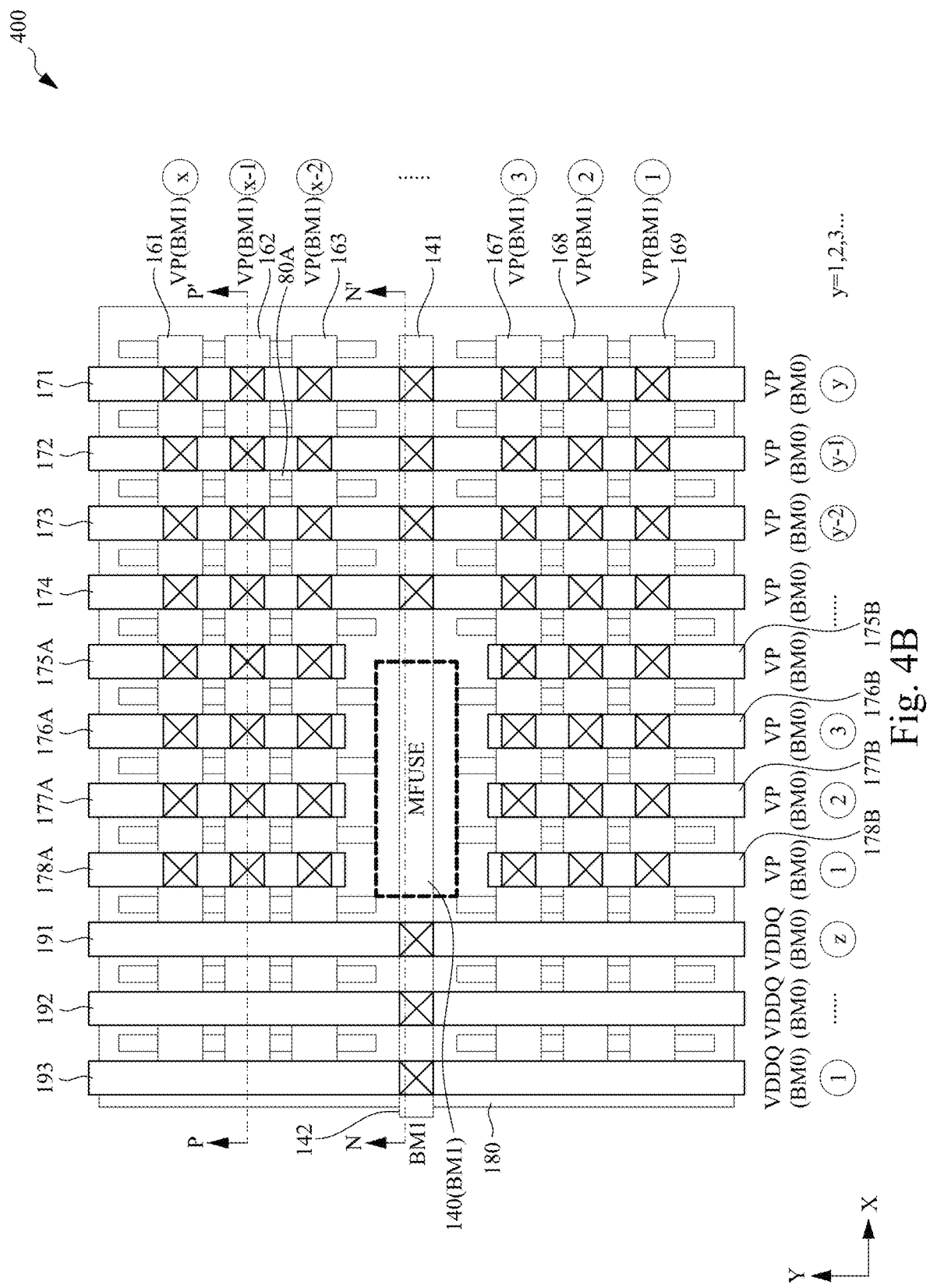

FIGS. 4A-4B are layout diagrams of an efuse bit cell 400, in accordance with some embodiments. The layout diagram in FIG. 4A includes the layout designs for first and second metal layers at the front-side of the substrate 410, and the layout diagram in FIG. 4B includes the layout designs for first and second backside metal layers at the backside of the substrate 410. The layout design for the connections of the transistors in the efuse bit cell 400 is specified by FIG. 7. FIG. 4C is the cross-sectional view of the efuse bit cell in a cutting plane P-P' as specified in FIGS. 4A-4B and FIG. 7, in accordance with some embodiments. FIG. 4D is the cross-sectional view of the efuse bit cell 400 in a cutting plane N-N' as specified in FIGS. 4A-4B and FIG. 7, in accordance with some embodiments. The equivalent circuit of the efuse bit cell 400 is shown in FIG. 8A.

The layout design of the elements in the efuse bit cell 400 at the front-side of the substrate 410 (as specified by FIG. 4A and FIG. 7) is identical to the layout designs of the elements in the efuse bit cell 300 at the front-side of the substrate 310 (as specified by the layout designs in FIG. 3A and FIG. 7). The common elements at the front-side of the substrates (410 and 310) includes the semiconductor structures (80A and 80B), the gate-conductors (51A-59A and 51B-59B), the terminal-conductors (30A-39A and 30B-39B), and the dummy gate-conductors (50L and 50R). The common elements at the front-side of the substrates (410 and 310) also include the front-side horizontal conducting lines (61-63 and 67-69) and front-side vertical conducting lines (71-78 and 70a-70c), and various front-side via connectors.

The layout designs of the elements in the efuse bit cell 400 at the backside of the substrate 410 are depicted in FIG. 4B. The layout design in FIG. 4B is different from the layout design in FIG. 3B with respect to the orientation of the backside conducting lines in the first and the second backside metal layers and with respect to the location of the backside fuse element. The backside horizontal conducting lines (161-163 and 167-169) in FIG. 4B are in the second backside metal layer BM1, whereas the backside horizontal conducting lines (161-163 and 167-169) in FIG. 3B are in the first backside metal layer BM0. The backside vertical conducting lines (171-174, 175A-178A, and 175B-178B) in FIG. 4B are in the first backside metal layer BM0, whereas the backside vertical conducting lines (171-174, 175A-178A, and 175B-178B) in FIG. 3B are in the second backside metal layer BM1. The backside bit connection lines 191-193 in FIG. 4B are in the first backside metal layer BM0, whereas the backside bit connection lines 191-193 in FIG. 3B are in the second backside metal layer BM1. Additionally, the fuse element 140(BM1) in FIG. 4B is a metal fuse formed in the second backside metal layer BM1, whereas the fuse element 140(BM2) in FIG. 3B is a metal fuse formed in the third backside metal layer BM2.

In FIG. 4B and FIGS. 4C-4D, each of the backside vertical conducting lines 171, 173, 175A, and 177A is conductively connected to a corresponding one of drain terminal-conductors 30A, 32A, 34A, and 36A through a backside terminal via-connector BVD. Each of the backside vertical conducting lines 171, 173, 175B, and 177B is conductively connected to a corresponding one of drain terminal-conductors 30B, 32B, 34B, and 36B through a backside terminal via-connector BVD.

In FIG. 4B and FIGS. 4C-4D, each of the first fuse terminal 141, the fuse element 140(BM1), and the second fuse terminal 142 is formed in a part of a metal line extending in the X-direction in the second backside metal layer BM1. The first fuse terminal 141 is conductively connected to each of the backside vertical conducting lines 171-174 through a corresponding backside metal-to-metal connector BV0. The second fuse terminal 142 is conductively connected to each of the backside bit connection line 191-193 through a corresponding backside metal-to-metal connector BV0.

In FIG. 4B and FIGS. 4C-4D, each of the first fuse terminal 141, the fuse element 140(BM1), and the second fuse terminal 142 is formed in the same second backside metal layer BM1. In some alternative embodiments, the first fuse terminal 141, the fuse element 140(BM1), and the second fuse terminal 142 are in the different third metal layers. For example, in some alternative embodiments, each of the first fuse terminal 141 and the second fuse terminal 142 is in the second backside metal layer BM1, while the fuse element 140 is a metal fuse in the fourth backside metal layer BM3, and the fuse element 140 is connected to the fuse terminals through various via connectors. In some alternative embodiments, each of the first fuse terminal 141 and the fuse element 140(BM1) is in the second backside metal layer BM1, while the second fuse terminal 142 is in the fourth backside metal layer BM3, and the fuse element 140(BM1) is connected to the second fuse terminal 142 through various via connectors. A metal fuse is an example of an efuse for use as the fuse element. Other types of efuse for use as the fuse element are within the contemplated scope of the present disclosure.

In FIGS. 4A-4B, a mesh structure for the power node is formed at the front-side of the substrate 410 by interconnecting the front-side horizontal conducting lines with the front-side vertical conducting lines. A mesh structure for the efuse node VP is formed at the backside of the substrate 410 by interconnecting the backside horizontal conducting lines with the backside vertical conducting lines. In some embodiments, when the transistors in the semiconductor structures 80A and 80B are n-channel transistors, the equivalent circuit of the efuse bit cell 400 is shown in FIG. 8A. The power node for the efuse bit cell 400 is configured to receive the supply voltage VSS. The first fuse terminal 141 of the fuse element 140(BM1) is connected to the efuse node VP. The second fuse terminal 142 of the fuse element 140(BM1) is connected to the bit node VDDQ.

Figure 5A:
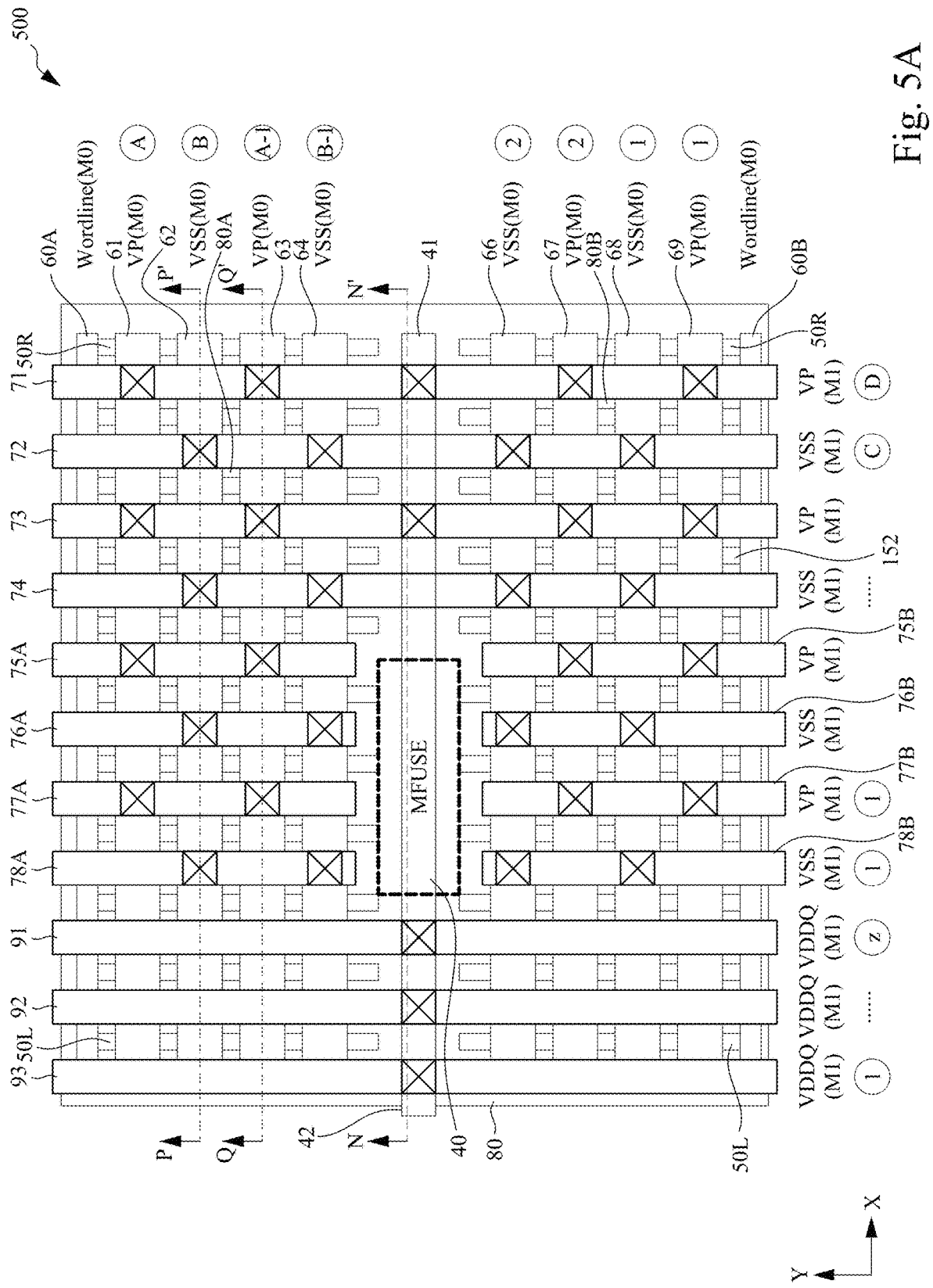
FIGS. 5A-5B are layout diagrams of an efuse bit cell, in accordance with some embodiments.
Figure 5B:
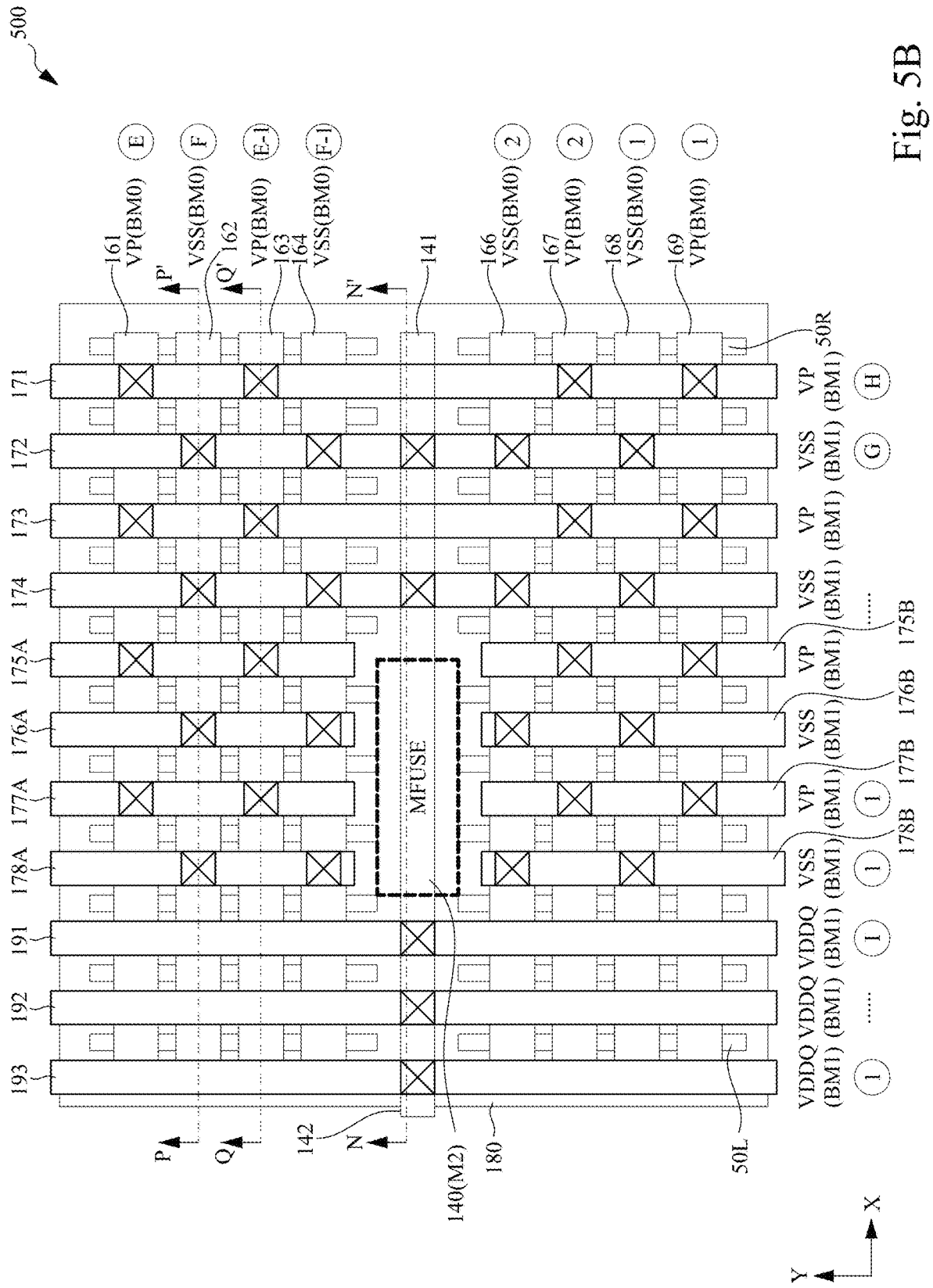
Figure 5C:
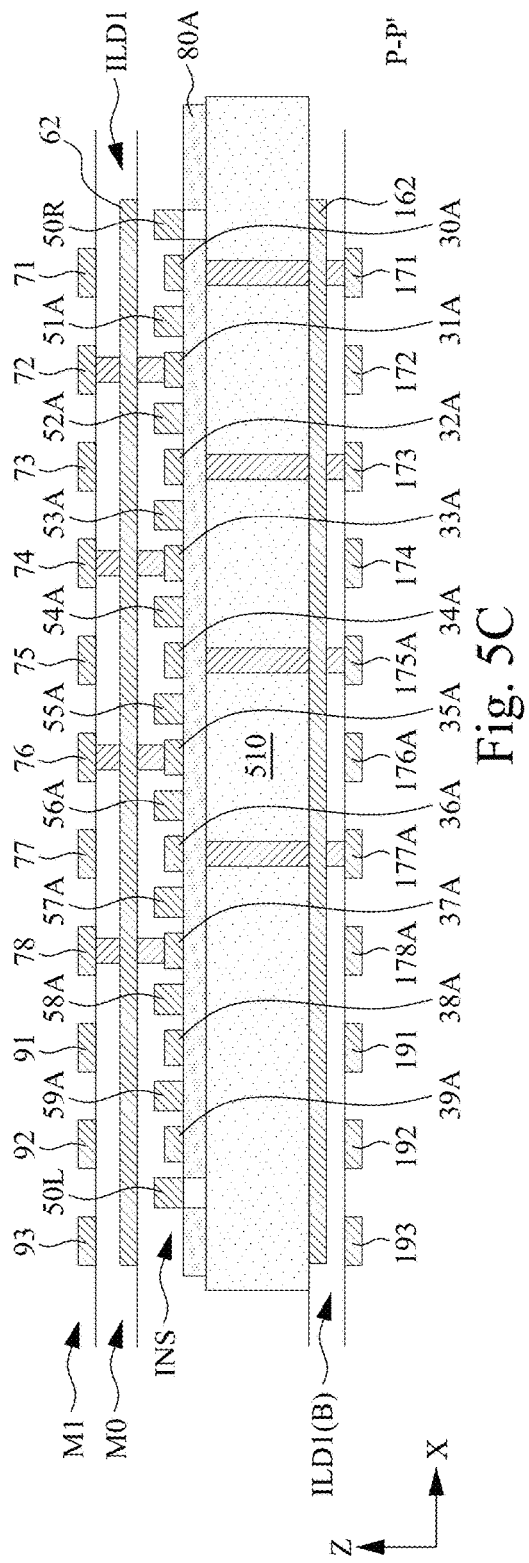
FIGS. 5C-5D are cross-sectional views of the efuse bit cell in FIGS. 5A-5B and FIG. 7, in accordance with some embodiments.
Figure 5D:
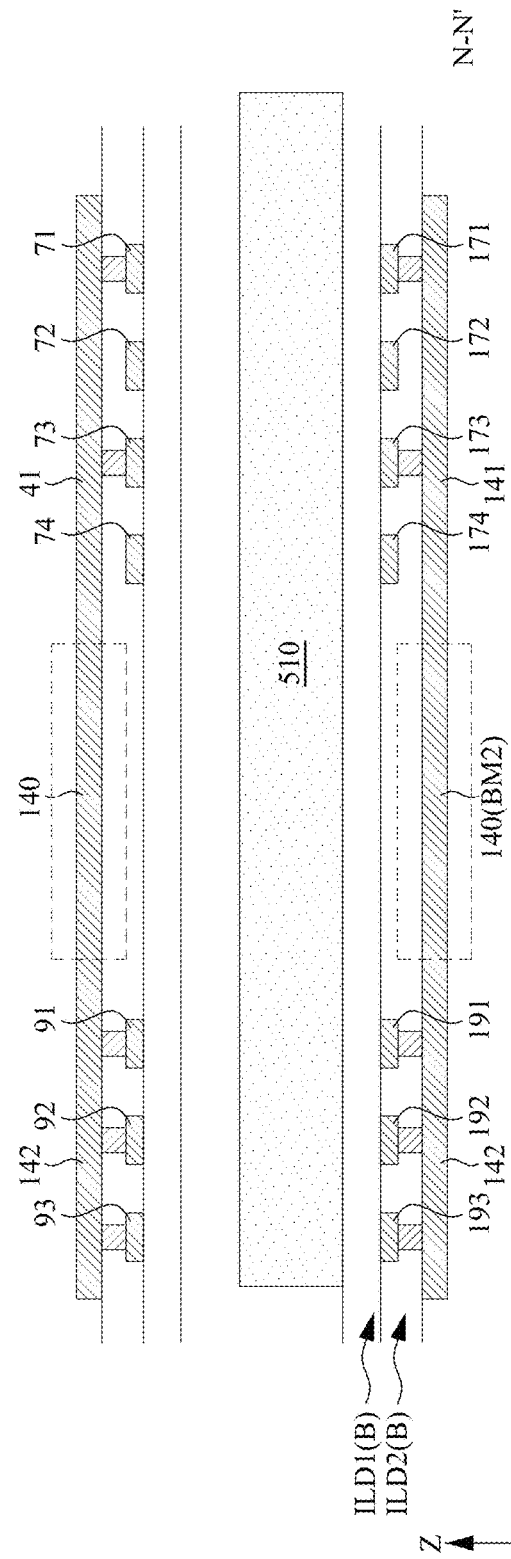
Figure 9A:
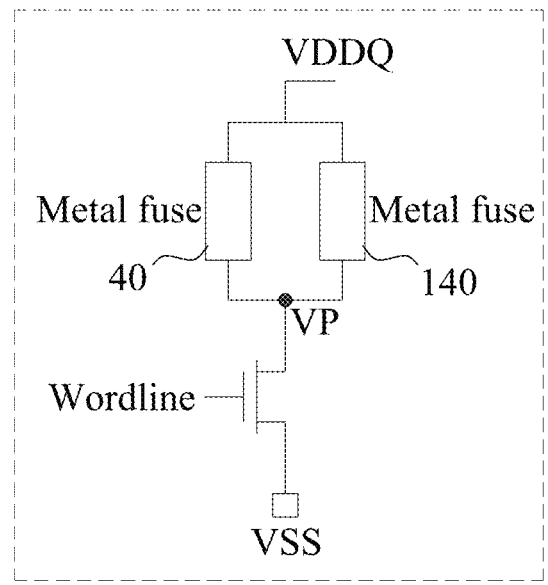
FIGS. 9A-9B are the equivalent circuits of some efuse bit cells as disclosed, in accordance with some embodiments.

FIGS. 5A-5B are layout diagrams of an efuse bit cell 500, in accordance with some embodiments. The layout diagram in FIG. 5A includes the layout designs for first and second metal layers at the front-side of the substrate 510, and the layout diagram in FIG. 5B includes the layout designs for first and second backside metal layers at the backside of the substrate 510. The layout design for the connections of the transistors in the efuse bit cell 500 is specified by FIG. 7. FIG. 5C is the cross-sectional view of the efuse bit cell in a cutting plane P-P' as specified in FIGS. 5A-5B and FIG. 7, in accordance with some embodiments. FIG. 5D is the cross-sectional view of the efuse bit cell 500 in a cutting plane N-N' as specified in FIGS. 5A-5B and FIG. 7, in accordance with some embodiments. The equivalent circuit of the efuse bit cell 500 is shown in FIG. 9A.

In FIG. 5A and FIGS. 5C-5D, the efuse bit cell 500 includes front-side horizontal conducting lines (61-63 and 67-69) extending in the X-direction in the first metal layer M0. Each of the front-side horizontal conducting lines 62 and 64 is directly connected to the source terminal-conductors 31A, 33A, 35A, 37A, and 39A through the corresponding front-side terminal via-connectors VD. Each of the front-side horizontal conducting lines 66 and 68 is directly connected to the source terminal-conductors 31B, 33B, 35B, 37B, and 39B through the corresponding front-side terminal via-connectors VD. Each of the front-side horizontal conducting lines 61 and 63 is directly connected to the drain terminal-conductors 30A, 32A, 34A, 36A, and 38A through the corresponding front-side terminal via-connectors VD. Each of the front-side horizontal conducting lines 67 and 69 is directly connected to the drain terminal-conductors 30B, 32B, 34B, 36B, and 38B through the corresponding front-side terminal via-connectors VD.

In FIG. 5A and FIGS. 5C-5D, the efuse bit cell 500 includes word connection lines (60A and 60B) extending in the X-direction in the first metal layer M0. The word connection line 60A is directly connected to the gate-conductors through the gate via-connectors (51A-59A) through the corresponding front-side gate via-connectors VG. The word connection line 60B is directly connected to the gate-conductors through the gate via-connectors (51B-59B) through the corresponding front-side gate via-connectors VG.

In FIG. 5A and FIGS. 5C-5D, the efuse bit cell 500 includes front-side vertical conducting lines (71-74, 75A-78A, and 75B-78B) extending in the Y-direction in the second metal layer M1. The efuse bit cell 500 also includes bit connection lines 91-93 extending in the Y-direction in the second metal layer M1. Each of the front-side vertical conducting lines 72 and 74 is directly connected to the front-side horizontal conducting lines 62, 64, 66, and 68 through the corresponding front-side metal-to-metal via-connectors V0. Each of the front-side vertical conducting lines 71 and 73 is directly connected to the front-side horizontal conducting lines 61, 63, 67, and 69. Each of the front-side vertical conducting lines 76A and 78A is directly connected to the front-side horizontal conducting lines 62 and 64 through the corresponding front-side metal-to-metal via-connectors V0. Each of the front-side vertical conducting lines 76B and 78B is directly connected to the front-side horizontal conducting lines 66 and 68 through the corresponding front-side metal-to-metal via-connectors V0. Each of the front-side vertical conducting lines 75A and 77A is directly connected to the front-side horizontal conducting lines 61 and 63 through the corresponding front-side metal-to-metal via-connectors V0. Each of the front-side vertical conducting lines 75B and 77B is directly connected to the front-side horizontal conducting lines 67 and 69 through the corresponding front-side metal-to-metal via-connector V0.

In FIG. 5A, a mesh structure for the power node is formed at the front-side of the substrate 610 by interconnecting the front-side horizontal conducting lines 62, 64, 66, and 68 with the front-side vertical conducting lines 72, 74, 76A, 76B, 78A, and 78B. A mesh structure for the efuse node VP is formed at the front-side of the substrate 610 by interconnecting the front-side horizontal conducting lines 61, 63, 67, and 69 with the front-side vertical conducting lines 71, 73, 75A, 75B, 77A, and 77B.

In FIG. 5A and FIGS. 5C-5D, the efuse bit cell 500 includes a fuse element 40 formed in a part of a metal line extending in the X-direction in the third metal layer M2. The fuse element 40 has a first fuse terminal 41 conductively connected to each of the front-side vertical conducting lines 71 and 73 through a corresponding front-side via-one connector V1. The fuse element 40 has a second fuse terminal 42 conductively connected to each of the bit connection lines 91-93 through a corresponding front-side via-one connector V1.

In FIG. 5B and FIGS. 5C-5D, the efuse bit cell 500 includes backside horizontal conducting lines (161-164 and 166-169) extending in the X-direction in the first backside metal layer BM0. Each of the backside horizontal conducting lines 162 and 164 is directly connected to the source terminal-conductors 31A, 33A, 35A, 37A, and 39A through a corresponding backside terminal via-connector BVD. Each of the backside horizontal conducting lines 166 and 168 is directly connected to the source terminal-conductors 31B, 33B, 35B, 37B, and 39B through a corresponding backside terminal via-connector BVD. Each of the backside horizontal conducting lines 161 and 163 is directly connected to the drain terminal-conductors 30A, 32A, 34A, 36A, and 38A through a corresponding backside terminal via-connector BVD. Each of the backside horizontal conducting lines 167 and 169 is directly connected to the drain terminal-conductors 30B, 32B, 34B, 36B, and 38B through the corresponding backside terminal via-connectors BVD.

In FIG. 5B and FIGS. 5C-5D, the efuse bit cell 500 includes backside vertical conducting lines (171-174, 175A-178A, and 175B-178B) extending in the Y-direction in the second backside metal layer BM1. The efuse bit cell 500 also includes backside bit connection lines 191-193 extending in the Y-direction in the second backside metal layer BM1. Each of the backside vertical conducting lines 172 and 174 is directly connected to the backside horizontal conducting lines 162, 164, 166, and 168 through the corresponding backside metal-to-metal via-connectors BV0. Each of the backside vertical conducting lines 171 and 173 is directly connected to the backside horizontal conducting lines 161, 163, 167, and 169. Each of the backside vertical conducting lines 176A and 178A is directly connected to the backside horizontal conducting lines 162 and 164 through the corresponding backside metal-to-metal via-connectors BV0. Each of the backside vertical conducting lines 176B and 178B is directly connected to the backside horizontal conducting lines 166 and 168 through the corresponding backside metal-to-metal via-connectors BV0. Each of the backside vertical conducting lines 175A and 177A is directly connected to the backside horizontal conducting lines 161 and 163 through the corresponding backside metal-to-metal via-connectors BV0. Each of the backside vertical conducting lines 175B and 177B is directly connected to the backside horizontal conducting lines 167 and 169 through the corresponding backside metal-to-metal via-connectors BV0.

In FIG. 5B, a mesh structure for the power node is formed at the backside of the substrate 510 by interconnecting the backside horizontal conducting lines 162, 164, 166, and 168 with the backside vertical conducting lines 172, 174, 176A, 176B, 178A, and 178B. A mesh structure for the efuse node VP is formed at the backside of the substrate 510 by interconnecting the backside horizontal conducting lines 161, 163, 167, and 169 with the front-side vertical conducting lines 171, 173, 715A, 175B, 177A, and 177B.

In FIG. 5B and FIGS. 5C-5D, the efuse bit cell 500 includes a backside fuse element 140(BM2) formed in a part of a metal line extending in the X-direction in the third backside metal layer BM2. The backside fuse element 140(BM2) has a first fuse terminal 141 conductively connected to each of the backside vertical conducting lines 171 and 173 through a corresponding backside via-one connector BV1. The fuse element 140 has a second fuse terminal 142 is conductively connected to each of the bit connection line 191-193 through a corresponding backside via-one connector BV1.

In some embodiments, when the transistors in the semiconductor structures 80A and 80B are n-channel transistors, the equivalent circuit of the efuse bit cell 500 is shown in FIG. 9A. The power node for the efuse bit cell 500 is configured to receive the supply voltage VSS. The first fuse terminals 41 and 141 of the fuse elements are connected to the efuse node VP. The second fuse terminals 42 and 142 of the fuse elements are connected to the bit node VDDQ.

Figure 6A:
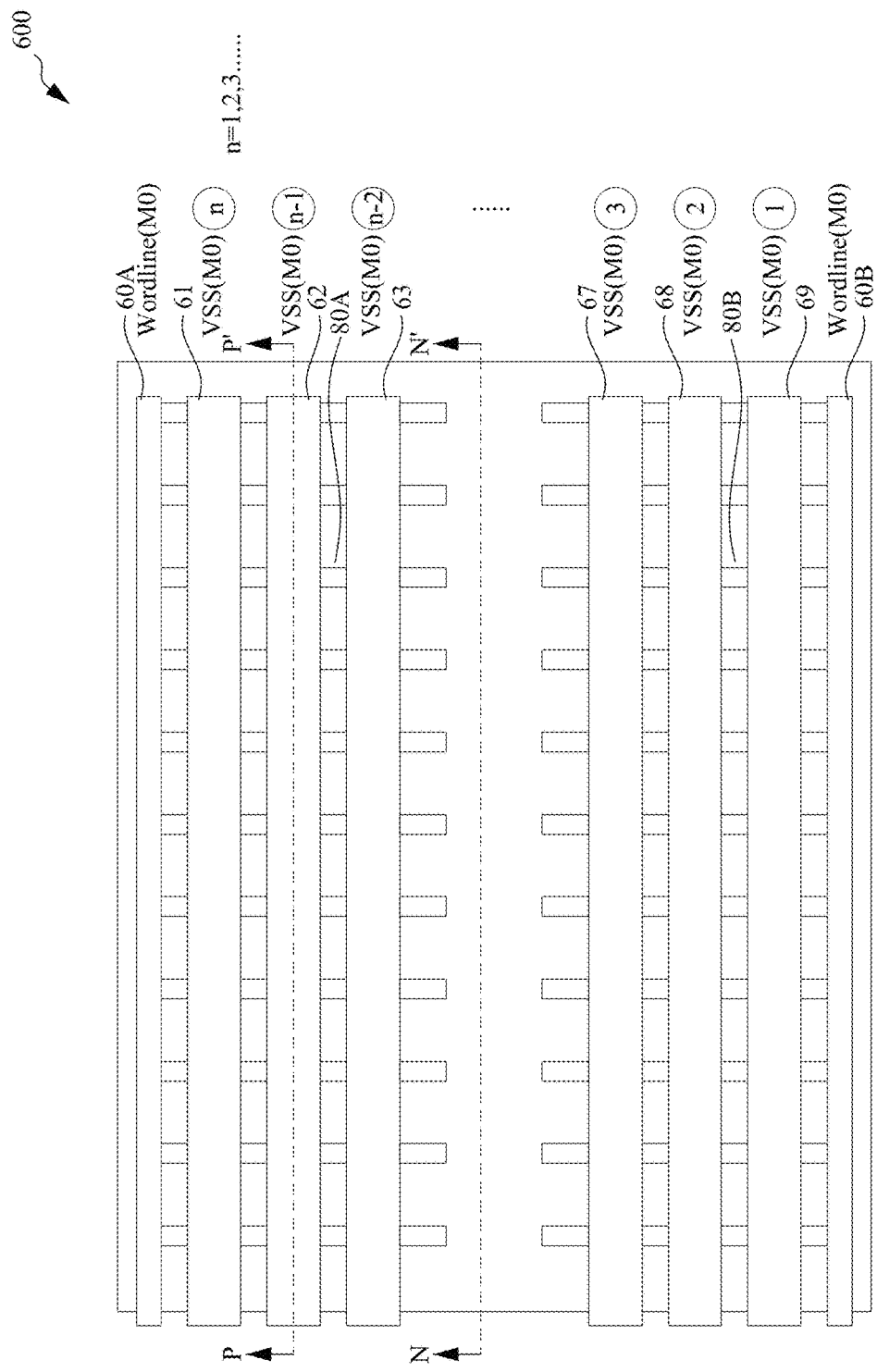
FIGS. 6A-6B are layout diagrams of an efuse bit cell, in accordance with some embodiments.
Figure 6B:
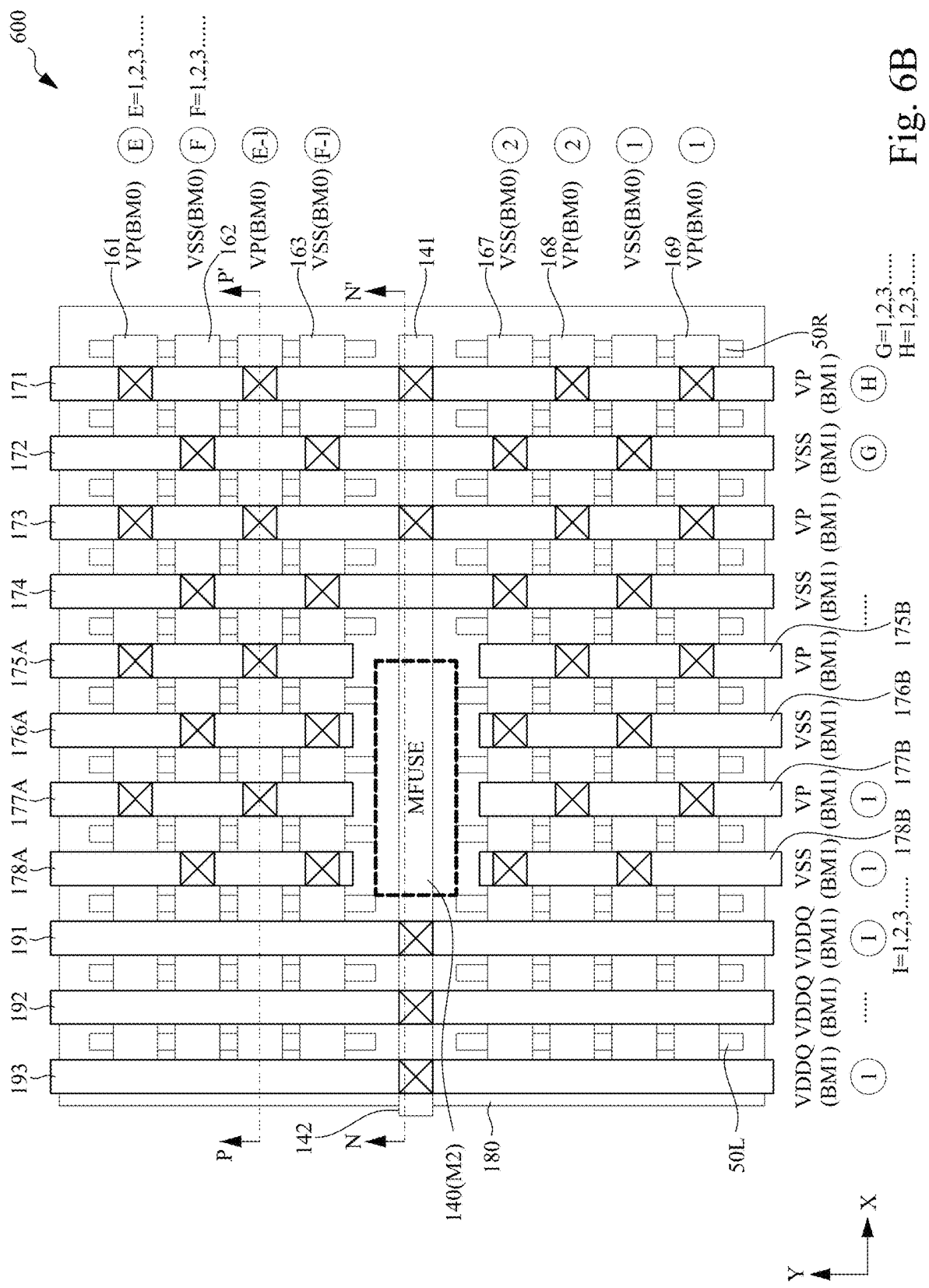
Figure 6C:
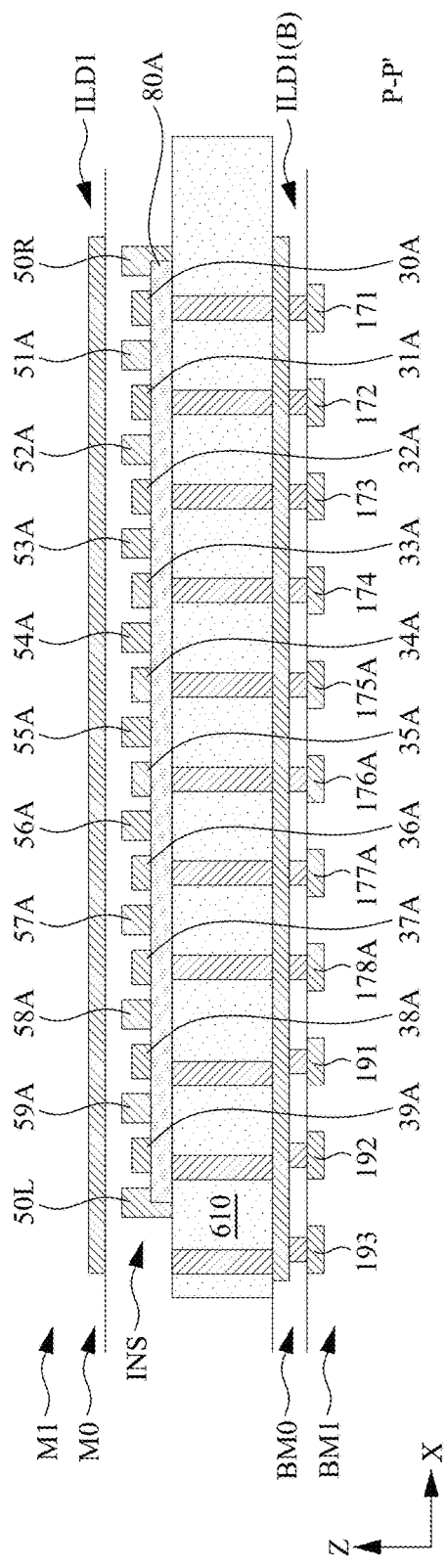
FIGS. 6C-6D are cross-sectional views of the efuse bit cell in FIGS. 6A-6B and FIG. 7, in accordance with some embodiments.
Figure 6C:
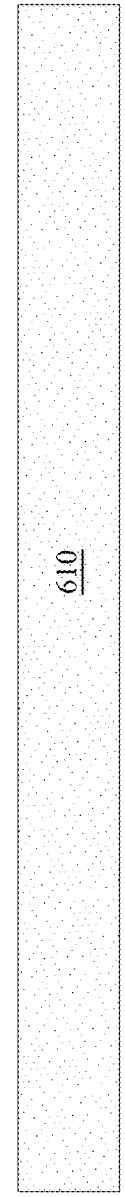
Figure 6D:
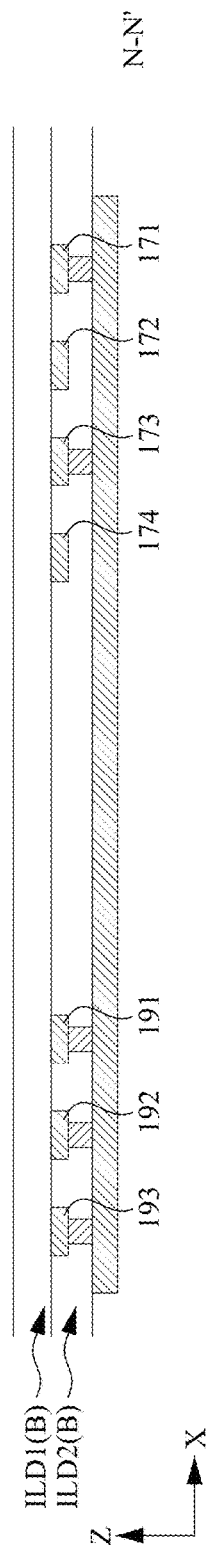

FIGS. 6A-6B are layout diagrams of an efuse bit cell 600, in accordance with some embodiments. The layout diagram in FIG. 6A includes the layout designs for first metal layer at the front-side of the substrate 610, and the layout diagram in FIG. 6B includes the layout designs for first and second backside metal layers at the backside of the substrate 610. The layout design for the connections of the transistors in the efuse bit cell 600 is specified by FIG. 7. FIG. 6C is the cross-sectional view of the efuse bit cell in a cutting plane P-P' as specified in FIGS. 6A-6B and FIG. 7, in accordance with some embodiments. FIG. 6D is the cross-sectional view of the efuse bit cell 600 in a cutting plane N-N' as specified in FIGS. 6A-6B and FIG. 7, in accordance with some embodiments. The equivalent circuit of the efuse bit cell 600 is shown in FIG. 8A.

The layout designs of the elements in the efuse bit cell 600 at the front-side of the substrate 610 are depicted in FIG. 6A and FIG. 7. In FIG. 6A and FIGS. 6C-6D, the efuse bit cell 600 includes front-side horizontal conducting lines (61-63 and 67-69) extending in the X-direction in the first metal layer M0. Each of the front-side horizontal conducting lines 61-63 is directly connected to the source terminal-conductors 31A, 33A, 35A, 37A, and 39A through the corresponding front-side terminal via-connectors VD. Each of the front-side horizontal conducting lines 67-69 is directly connected to the source terminal-conductors 31B, 33B, 35B, 37B, and 39B through the corresponding front-side terminal via-connectors VD. In some embodiments, the efuse bit cell 600 also includes front-side vertical conducting lines (not shown in FIG. 6A) extending in the Y-direction in the second metal layer M1. In some embodiments, a mesh structure for the power node is formed at the front-side of the substrate 610 by interconnecting the front-side horizontal conducting lines with the front-side vertical conducting lines.

The layout designs of the elements in the efuse bit cell 600 at the backside of the substrate 610 are depicted in FIG. 6B. The layout designs of the elements in the efuse bit cell 600 at the backside of the substrate 610 (as specified by in FIG. 6B) is identical to the layout designs of the elements in the efuse bit cell 500 at the backside of the substrate 510 (as specified by the layout designs in FIG. 5B). The common elements at the backside of the substrates 610 and 510 includes the backside horizontal conducting lines (161-164 and 166-169), the backside vertical conducting lines (171-174, 175A-178A, and 175B-178B), the backside bit connection lines 191-193, the backside fuse element 140(BM2), and various backside via connectors.

In FIG. 6B, a mesh structure for the power node is formed at the backside of the substrate 610 by interconnecting the backside horizontal conducting lines 162, 164, 166, and 168 with the backside vertical conducting lines 172, 174, 176A, 176B, 178A, and 178B. A mesh structure for the efuse node VP is formed at the backside of the substrate 610 by interconnecting the backside horizontal conducting lines 161, 163, 167, and 169 with the front-side vertical conducting lines 171, 173, 715A, 175B, 177A, and 177B. In some embodiments, when the transistors in the semiconductor structures 80A and 80B are n-channel transistors, the equivalent circuit of the efuse bit cell 600 is shown in FIG. 8A. The power node for the efuse bit cell 600 is configured to receive the supply voltage VSS. The first fuse terminal 141 of the fuse element 140(BM2) is connected to the efuse node VP. The second fuse terminal 142 of the fuse element 140(BM2) is connected to the bit node VDDQ.

Figure 8B:
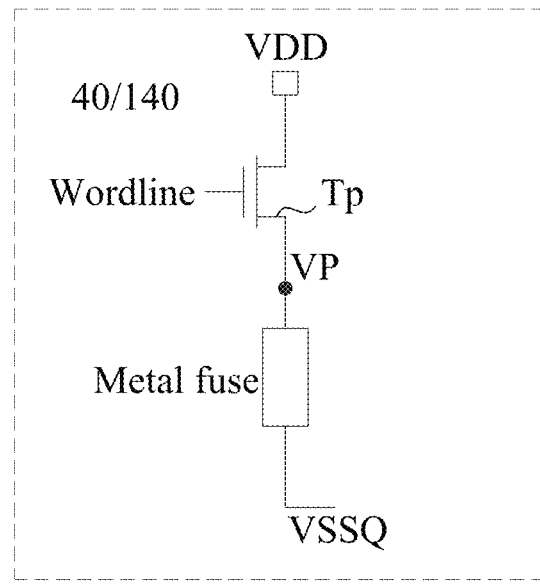

FIGS. 8A-8B are the equivalent circuits of some efuse bit cells as disclosed, in accordance with some embodiments. Specifically, FIG. 8A is the equivalent circuit of the efuse bit cell as specified by the layout diagrams in FIGS. 1A-1B, FIGS. 2A-2B, FIGS. 3A-3B, FIGS. 4A-4B, and FIGS. 6A-6B, when the transistors in the semiconductor structures 80A and 80B are n-channel transistors. FIG. 8B is the equivalent circuit of the efuse bit cell as specified by the layout diagrams in in FIGS. 1A-1B, FIGS. 2A-2B, FIGS. 3A-3B, FIGS. 4A-4B, and FIGS. 6A-6B, when the transistors in the semiconductor structures 80A and 80B are p-channel transistors.

Figure 9B:
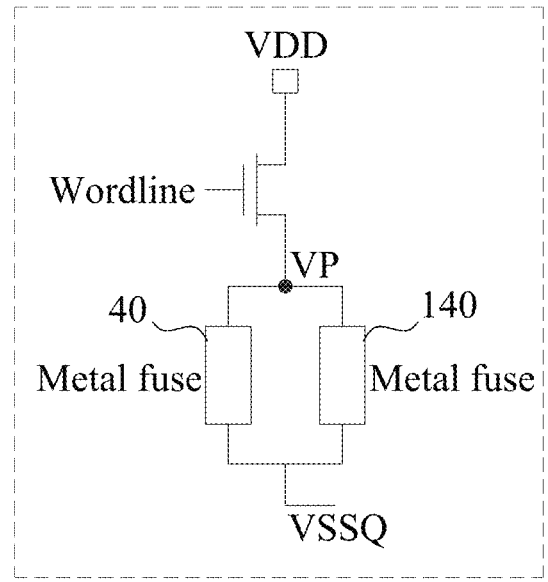

FIGS. 9A-9B are the equivalent circuits of some efuse bit cells as disclosed, in accordance with some embodiments. Specifically, FIG. 9A is the equivalent circuit of the efuse bit cell as specified by the layout diagrams in FIGS. 5A-5B, when the transistors in the semiconductor structures 80A and 80B are n-channel transistors. FIG. 9B is the equivalent circuit of the efuse bit cell as specified by the layout diagrams in FIGS. 5A-5B, when the transistors in the semiconductor structures 80A and 80B are p-channel transistors.

In some embodiments, as shown in FIG. 8A and FIG. 9A, when the transistors in the semiconductor structures 80A and 80B are n-channel transistors, the power node for the efuse bit cell is configured to receive the supply voltage VSS. The first fuse terminal (e.g., 41 or 141) of the fuse element is connected to the efuse node VP. The second fuse terminal (e.g., 42 or 142) of the fuse element is connected to the bit node VDDQ. In some alternative embodiments, as shown in FIG. 8B and FIG. 9B, when the transistors in the semiconductor structures 80A and 80B are p-channel transistors, the power node for the efuse bit cell is configured to receive the supply voltage VDD. The first fuse terminal (e.g., 41 or 141) of the fuse element is connected to the efuse node VP. The second fuse terminal (e.g., 42 or 142) of the fuse element is connected to the bit node VSSQ.

Figure 10A:
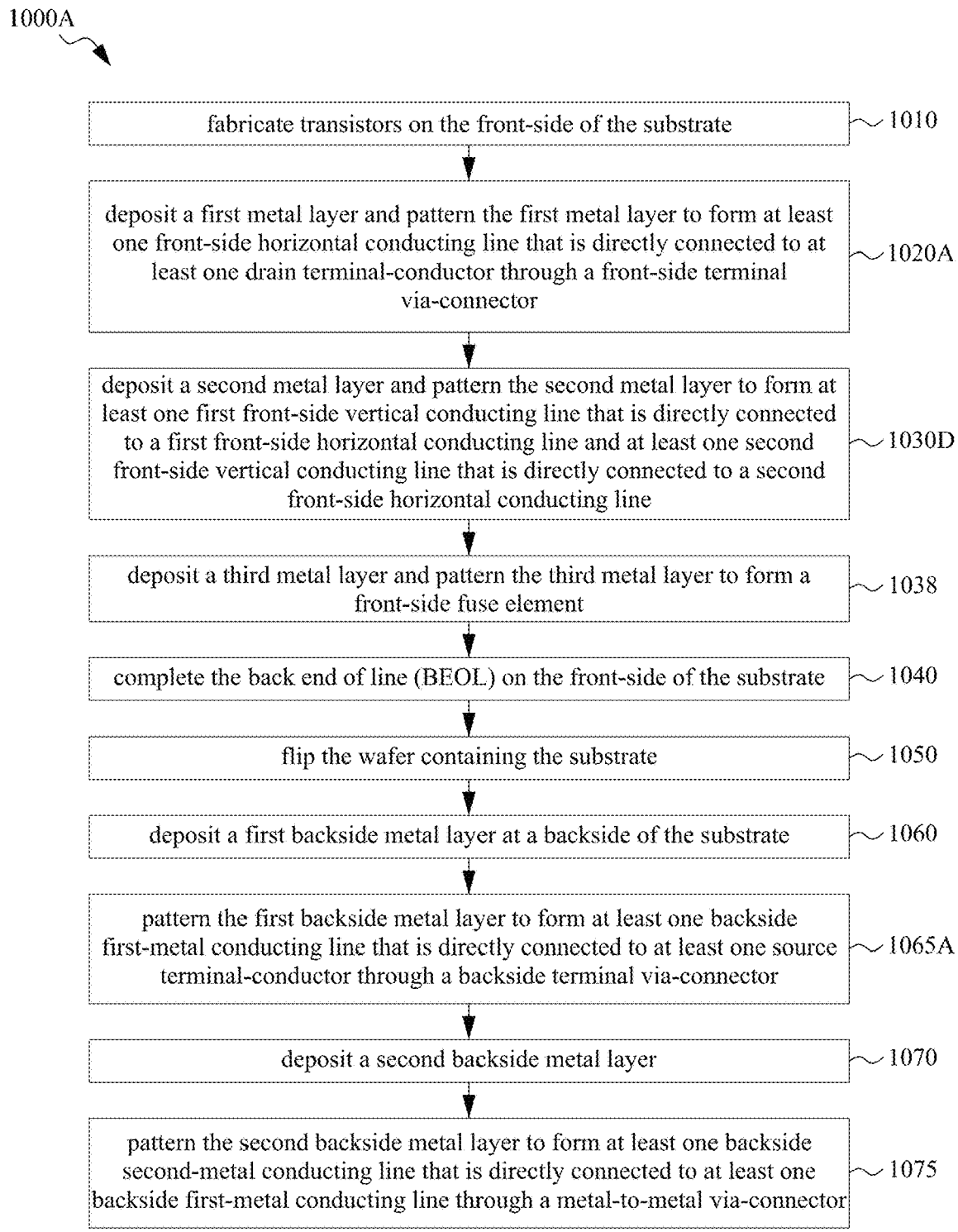
FIGS. 10A-10D are flow charts of the methods of fabricating an integrated circuit having efuse bit cells, in accordance with some embodiments.

FIGS. 10A-10D are flow charts of the methods of fabricating an integrated circuit having efuse bit cells, in accordance with some embodiments. FIG. 10A is the flow chart of method 1000A. In some embodiments, the integrated circuit fabricated with method 1000A includes the efuse bit cell 100 in FIGS. 1A-1B or the efuse bit cell 200 in FIGS. 2A-2B. In operation 1010 of method 1000A, transistors are fabricated on the front-side of the substrate. In operation 1020A of method 1000A, a first metal layer is deposited on the insulating materials covering the gate-conductors and the source/drain terminal-conductors of the transistors, and the first metal layer is patterned to form front-side horizontal conducting lines. At least one of the front-side horizontal conducting lines is directly connected to at least one drain terminal-conductors through the front-side terminal via-connector VD. For example, in FIG. 1C or FIG. 2C, the front-side horizontal conducting line 62 in the first metal layer M0 is directly connected to each of the drain terminal-conductors 30A, 32A, 34A, 36A, and 38A through a corresponding front-side terminal via-connector VD. After operation 1020A, the flow proceeds to operation 1030.

In operation 1030 of method 1000A, a second metal layer is deposited over a first layer of inter-layer dielectric that overlies the first metal layer, and the second metal layer is patterned to form front-side vertical conducting lines. At least one front-side vertical conducting line is directly connected to at least one front-side horizontal conducting lines through the front-side metal-to-metal via-connector V0. In the efuse bit cell 100 in FIGS. 1C-1D or FIGS. 2C-2D, for example, the second metal layer M1 is above the first metal layer M0 and is separated from the first metal layer M0 by a layer of inter-layer dielectric ILD1. In FIGS. 1A-1B or FIGS. 2A-2B, for example, each of the front-side vertical conducting lines 71-74 is directly connected to the front-side horizontal conducting lines 61-63 and 67-69 through the corresponding front-side metal-to-metal via-connectors V0. In FIG. 1D or FIG. 2D, for example, the front-side horizontal conducting line 62 in the first metal layer M0 is directly connected to each of the front-side vertical conducting lines 71-74 and 75A-78A in the second metal layer M1 through the corresponding front-side metal-to-metal via-connectors V0. After operation 1030, the flow proceeds to operation 1038

In operation 1038 of method 1000A, a third metal layer is deposited over a second layer of inter-layer dielectric that overlies the second metal layer, and the third metal layer is patterned to form a front-side fuse element. The front-side fuse element in the third backside metal layer is conductively connected to at least one front-side vertical conducting line. For example, in FIG. 1D or FIG. 2D, the third metal layer M2 is above the second metal layer M1 and is separated from the second metal layer M1 by a layer of inter-layer dielectric ILD2. In FIG. 1D or FIG. 2D, the fuse element 40 is formed in the third metal layer M2, and the first fuse terminal 41 is conductively connected to each of the front-side vertical conducting lines 71-74 through a corresponding front-side via-one connector V1. After operation 1038, the flow proceeds to operation 1040.

In operation 1040 of method 1000A, the back end of line (BEOL) on the front-side of the substrate is completed. In addition to the connections of the conducting lines in metal layers M0, M1, and M2 that are finished in previous operations, during the BEOL operation, the metal lines in other metal layers (such as M3, M4, . . . , and Mn) are fabricated and connected with various backside via connectors. After the BEOL operation is completed, the wafer containing the substrate is flipped for further processing.

After the wafer containing the substrate is flipped, next in operation 1060 of method 1000A, a first backside metal layer is deposited at a backside of the substrate. For example, in FIG. 1D or FIG. 2D, the first backside metal layer BM0 is deposited at the backside of the substrate 110 or the substrate 210. The backside of the substrate is opposite to the front-side of the substrate. In other words, the backside of the substrate and the front-side of the substrate are opposite sides of the substrate.

Then, in operation 1065A of method 1000A, the first backside metal layer is patterned to form backside first-metal conducting lines. At least one backside first-metal conducting line is directly connected to at least one source terminal-conductor through a backside terminal via-connector BVD. In some embodiments, the backside first-metal conducting lines formed in operation 1065A is the backside horizontal conducting lines. For example, in FIGS. 1A-1B and FIGS. 1C-1D, each of the backside horizontal conducting lines 161-163 in the first backside metal layer BM0 is directly connected to the source terminal-conductors 31A, 33A, 35A, 37A, and 39A through a corresponding backside terminal via-connector BVD. In some embodiments, the backside first-metal conducting lines formed in operation 1065A is the backside vertical conducting lines. For example, in FIGS. 2A-2B and FIGS. 2C-2D, each of the backside vertical conducting lines 172, 174, 176, 178 and 170b in the first backside metal layer BM0 is correspondingly connected to one of the source terminal-conductors 31A, 33A, 35A, 37A, and 39A through a corresponding backside terminal via-connectors BVD. After operation 1065A, the flow proceeds to operation 1070.

In operation 1070 of method 1000A, a second backside metal layer is deposited over a first layer of backside inter-layer dielectric that overlies the first backside metal layer. For example, in FIGS. 1C-1D and FIGS. 2C-2D, the second backside metal layer BM1 is deposited over the first backside metal layer BM0 and separated from the first backside metal layer BM0 by a layer of backside inter-layer dielectric ILD1(B).

Then, in operation 1075 of method 1000A, the second backside metal layer is patterned to form the backside second-metal conducting lines. At least one backside second-metal conducting line is directly connected to at least one backside first-metal conducting line through a metal-to-metal via-connector BV0. In some embodiments, the backside second-metal conducting lines formed in operation 1075 is the backside vertical conducting lines. For example, in FIGS. 1B and FIGS. 1C-1D, each of the backside vertical conducting lines (171-178 and 170a-170c) in the second backside metal layer BM1 (formed at operation 1075) is directly connected to the backside horizontal conducting lines (161-163 and 167-169) in the first backside metal layer BM0 through the corresponding backside metal-to-metal via-connectors BV0. In some embodiments, the backside second-metal conducting lines formed in operation 1075 is the backside horizontal conducting lines. For example, in FIG. 2B and FIGS. 2C-2D, each of the backside horizontal conducting lines (161-163 and 167-169) (formed at operation 1075) in the second backside metal layer BM1 is directly connected to the backside vertical conducting lines (171-178 and 170a-170c) in the first backside metal layer BM0 through the corresponding backside metal-to-metal via-connectors BV0. After operation 1075, the metal lines in other backside metal layers (such as, BM2, BM3, . . . , and BMn) are fabricated and connected by various backside via connectors.

Figure 10B:
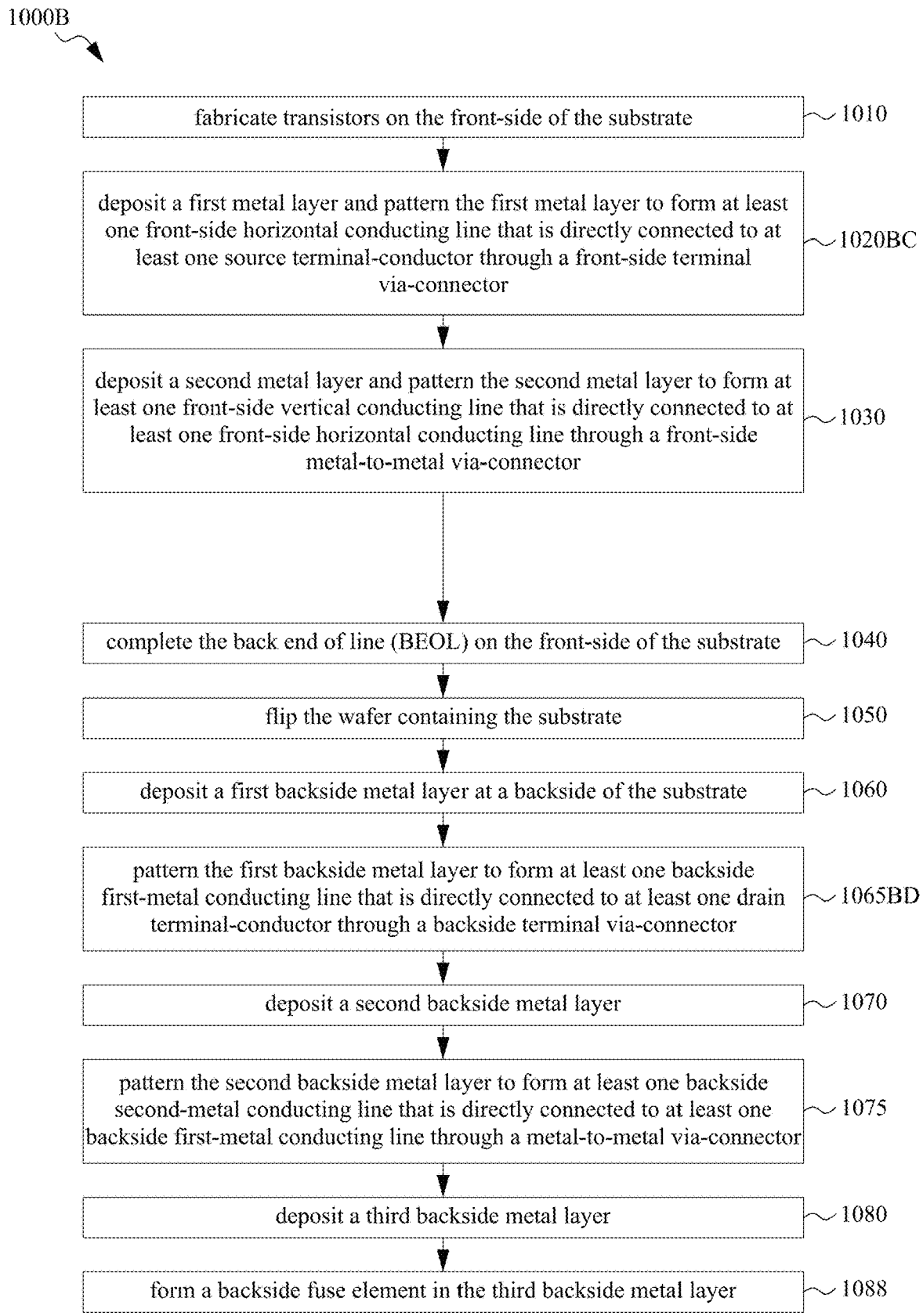
Figure 10C:
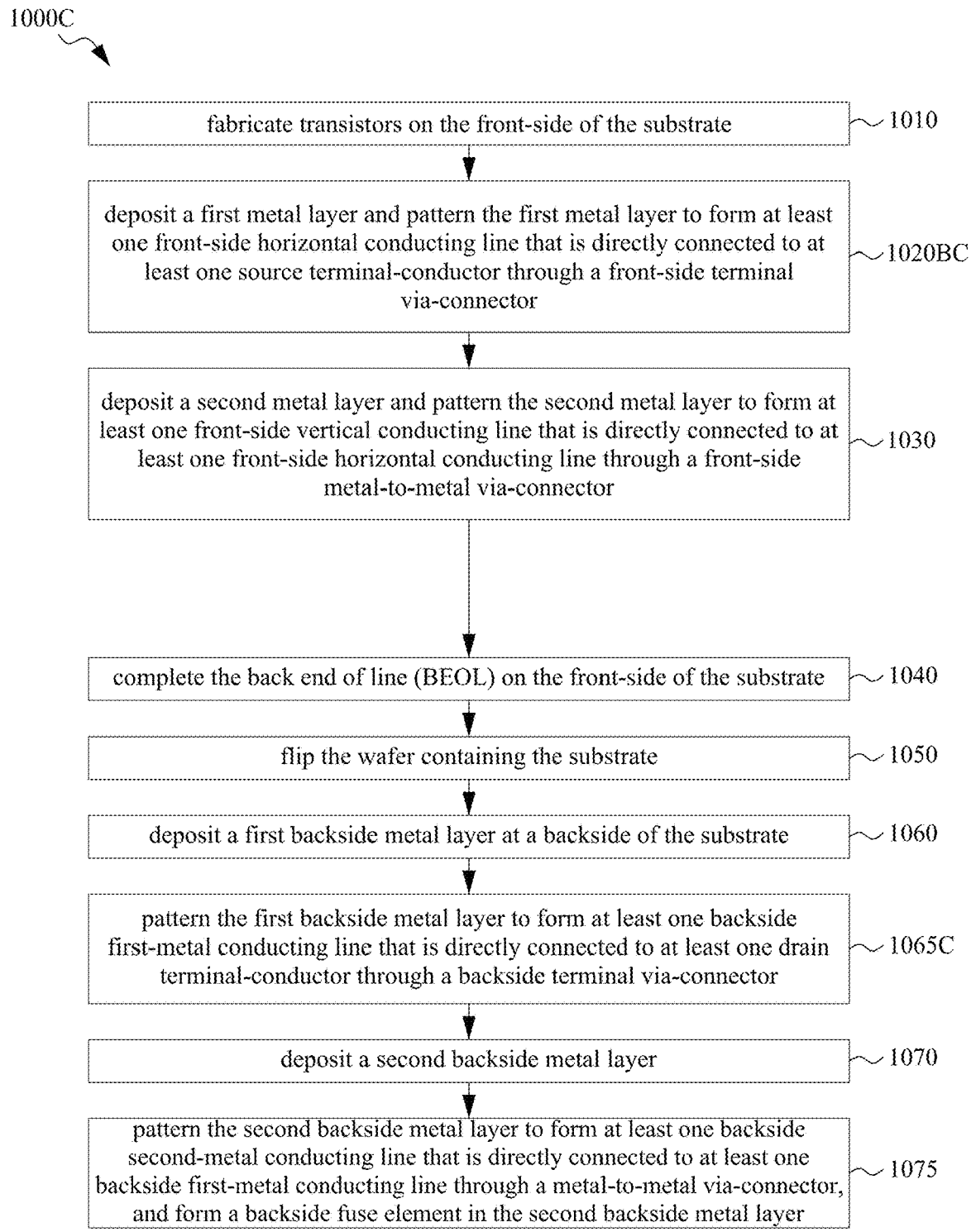

FIG. 10B is the flow chart of method 1000B. In some embodiments, the integrated circuit fabricated with method 1000B includes the efuse bit cell 300 in FIGS. 3A-3B. Some of the operations in method 1000B of FIG. 10B and in method 1000A of FIG. 10C are identical. The common operations in method 1000B and in method 1000A include operations 1010, 1030, 1040, 1050, 1060, 1070, and 1075.

Operation 1020A in method 1000A in FIG. 10A is substituted with operation 1020BC in method 1000B in FIG. 10B. Operation 1020BC of method 1000B is carried out between operation 1010 and operation 1030. In operation 1020BC of method 1000B, a first metal layer is deposited and the first metal layer is patterned to form front-side horizontal conducting lines. At least one of the front-side horizontal conducting lines is directly connected to at least one source terminal-conductors through the front-side terminal via-connector VD. For example, in FIG. 3C, the front-side horizontal conducting line 62 is directly connected to the source terminal-conductors 31A, 33A, 35A, 37A, and 39A through the corresponding front-side terminal via-connectors VD. The front-side horizontal conducting lines formed in operation 1020BC of method 1000B in FIG. 10B are parts of an interconnected mesh structure for the power node, whereas the front-side horizontal conducting lines formed in operation 1020A of method 1000A in FIG. 10A are parts of an interconnected mesh structure for the efuse node VP.

In the method 1000B of FIG. 10B, after operation 1030, the flow proceeds to operation 1040. Operation 1038 in method 1000A of FIG. 10A is not carried out in method 1000B of FIG. 10B.

In the method 1000B of FIG. 10B, operation 1065BD is carried out between operation 1060 and operation 1070. Operation 1065BD in method 1000B of FIG. 10B replaces operation 1065A in method 1000A of FIG. 10A. In operation 1065BD of method 1000B, the first backside metal layer is patterned to form backside first-metal conducting lines. At least one backside first-metal conducting line is directly connected to at least one drain terminal-conductor through a backside terminal via-connector BVD. For example, in FIG. 3B and FIGS. 3C-3D, each of the backside horizontal conducting lines 161-163 is directly connected to the drain terminal-conductors 30A, 32A, 34A, 36A, and 38A through a corresponding backside terminal via-connector BVD. The backside horizontal conducting lines formed in operation 1065BD of method 1000B in FIG. 10B are parts of an interconnected mesh structure for the efuse node VP, whereas the backside horizontal conducting lines formed in operation 1065A of method 1000A in FIG. 10A are parts of an interconnected mesh structure for the power node.

In the method 1000B of FIG. 10B, operation 1080 and operation 1088 are carried out after operation 1075. In operation 1080 of method 1000B, a third backside metal layer is deposited over a second layer of backside inter-layer dielectric that overlies the second backside metal layer. Then, in operation 1088 of method 1000B, a backside fuse element is formed in the third backside metal layer. For example, in FIG. 3D, the fuse element 140(BM2) is formed in the third backside metal layer BM2, and the first fuse terminal 141 is conductively connected to each of the front-side vertical conducting lines 171-174 through a corresponding backside via-one connector BV1. After operation 1088, the metal lines in other backside metal layers are fabricated and connected by various backside via connectors.

FIG. 10C is the flow chart of method 1000C. In some embodiments, the integrated circuit fabricated with method 1000C includes the efuse bit cell 400 in FIGS. 4A-4B. Some of the operations in method 1000C of FIG. 10C and in method 1000B of FIG. 10B are identical. The common operations in method 1000C and in method 1000B include operations 1010, 1020BC, 1030, 1040, 1050, 1060, and 1070.

In method 1000C of FIG. 10C, operation 1065C is carried out between operation 1060 and operation 1070. Operation 1065C in method 1000C of FIG. 10C replaces operation 1065BD in method 1000B of FIG. 10B. In operation 1065C of method 1000C, the first backside metal layer is patterned to form backside first-metal conducting lines that are backside vertical conducting lines. At least one backside first-metal conducting line is directly connected to at least one drain terminal-conductor through a backside terminal via-connector BVD. In FIG. 4B and FIGS. 4C-4D, as an example, the backside vertical conducting lines (171-174, 175A-178A, and 175B-178B) are formed in the first backside metal layer BM0. As an example, each of the backside vertical conducting lines 171, 173, 175A, and 177A is conductively connected to a corresponding one of drain terminal-conductors 30A, 32A, 34A, and 36A through a backside terminal via-connectors BVD. In method 1000C of FIG. 10C, the backside vertical conducting lines in the first backside metal layer BM0 are parts of an interconnected mesh structure for the efuse node VP.

In method 1000C of FIG. 10C, operation 1075C is carried out after operation 1070. For the processes of forming the backside efuse element, the operation 1075C in method 1000C of FIG. 10C replaces operations 1075, 1080, and 1088 in method 1000B of FIG. 10B. In operation 1075C of method 1000C, the second backside metal layer is patterned to form the backside second-metal conducting lines and to form the backside fuse element. At least one backside second-metal conducting line is directly connected to at least one backside first-metal conducting line through a metal-to-metal via-connector BV0. For example, in FIG. 4B and FIGS. 4C-4D, the fuse element 140(BM1) is formed in the second backside metal layer BM1, and the first fuse terminal 141 is conductively connected to each of the front-side vertical conducting lines 171-174 through a corresponding backside metal-to-metal connector BV0. After operation 1075C of method 1000C, the metal lines in other backside metal layers are fabricated and connected by various backside via connectors.

Figure 10D:
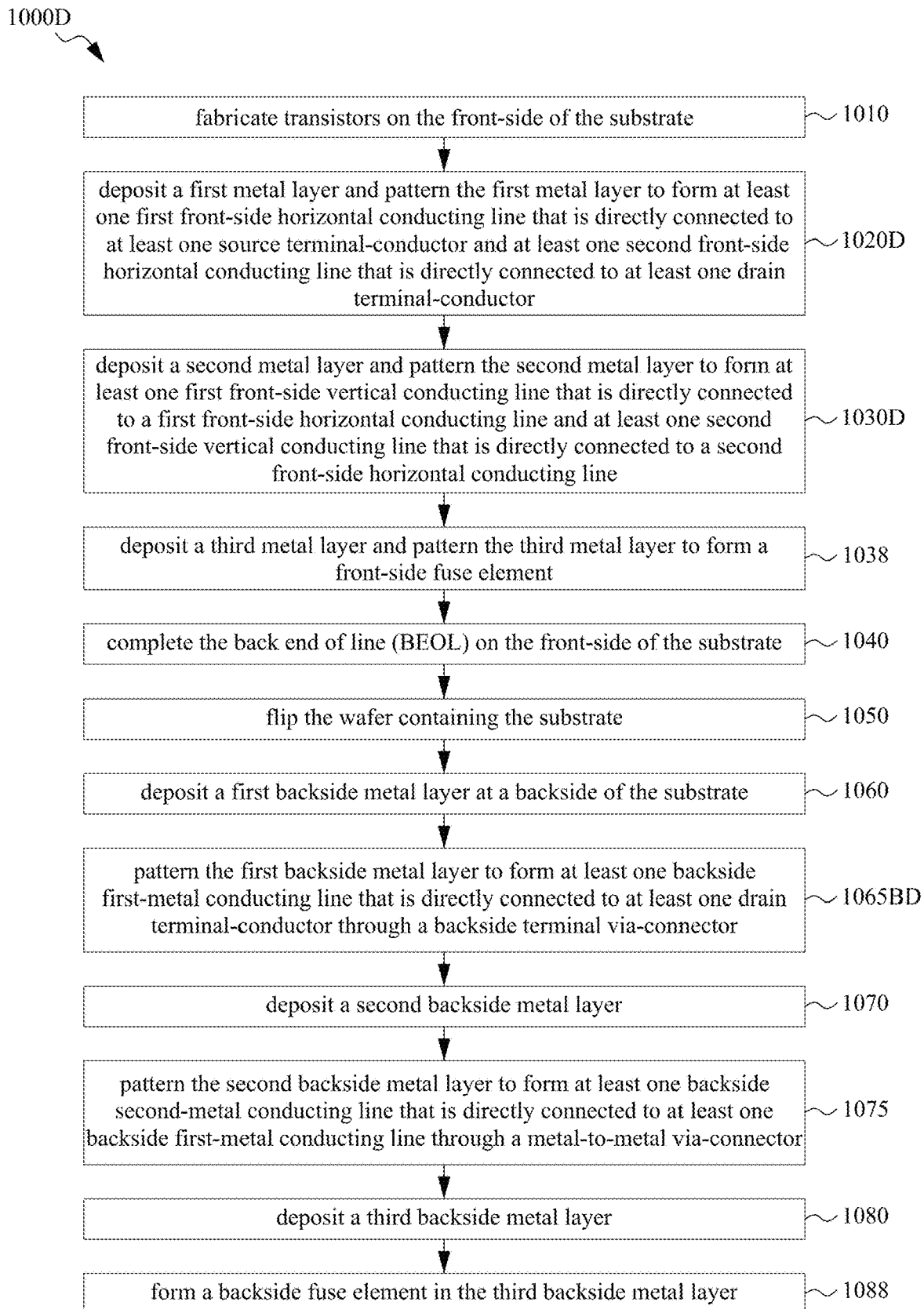

FIG. 10D is the flow chart of method 1000D. In some embodiments, the integrated circuit fabricated with method 1000D includes the efuse bit cell 500 in FIGS. 5A-5B. Some of the operations in method 1000D of FIG. 10D and in method 1000B of FIG. 10B are identical. The common operations in method 1000D and in method 1000B include operations 1010, 1030, 1040, 1050, 1060, 1065BD, 1070, 1080, and 1088.

In method 1000D of FIG. 10D, operations 1020D, 1030D, and 1038 are carried out between operation 1010 and 1040. Operation 1020D, 1030D, and 1038 in method 1000D of FIG. 10D replace operations 1020BC and 1030 in method 1000B of FIG. 10B.

In operation 1020D of method 1000D, a first metal layer is deposited and the first metal layer is patterned to form first front-side horizontal conducting lines and second front-side horizontal conducting lines. At least one first front-side horizontal conducting line that is directly connected to at least one source terminal-conductor, and at least one second front-side horizontal conducting line that is directly connected to at least one drain terminal-conductor. In FIG. 5A and FIGS. 5C-5D, for example, each of the first front-side horizontal conducting lines 62 and 64 formed in the first metal layer M0 is directly connected to the source terminal-conductors 31A, 33A, 35A, 37A, and 39A through the corresponding front-side terminal via-connectors VD. Each of the second front-side horizontal conducting lines 61 and 63 formed in the first metal layer M0 is directly connected to the drain terminal-conductors 30A, 32A, 34A, 36A, and 38A through the corresponding front-side terminal via-connectors VD.

In operation 1030D of method 1000D, a second metal layer is deposited over a first layer of inter-layer dielectric that overlies the first metal layer, and the second metal layer is patterned to form first front-side vertical conducting lines and second front-side vertical conducting lines. At least one first front-side vertical conducting line that is directly connected to a first front-side horizontal conducting line, and at least one second front-side vertical conducting line that is directly connected to a second front-side horizontal conducting line. In FIG. 5A and FIGS. 5C-5D, for example, each of the first front-side vertical conducting lines 72 and 74 is directly connected to the first front-side horizontal conducting lines 62, 64, 66, and 68 through the corresponding front-side metal-to-metal via-connectors V0. Each of the second front-side vertical conducting lines 71 and 73 is directly connected to the second front-side horizontal conducting lines 61, 63, 67, and 69.

In operation 1038 of method 1000D, a third metal layer is deposited over a second layer of inter-layer dielectric that overlies the second metal layer, and the third metal layer is patterned to form a front-side fuse element. The front-side fuse element in the third backside metal layer is conductively connected to at least one second front-side vertical conducting lines. For example, in FIG. 5A and FIGS. 5C-5D, a fuse element 40 is formed in the third metal layer M2, and the first fuse terminal 41 is conductively connected to each of the second front-side vertical conducting lines 71 and 73 through a corresponding front-side via-one connector V1.

After operation 1038 of method 1000D, operations 1040, 1050, 1060, 1065BD, 1070, 1075, 1080, and 1088 are carried out. After operation 1088, the metal lines in other backside metal layers are fabricated and connected by various backside via connectors.

Figure 11:
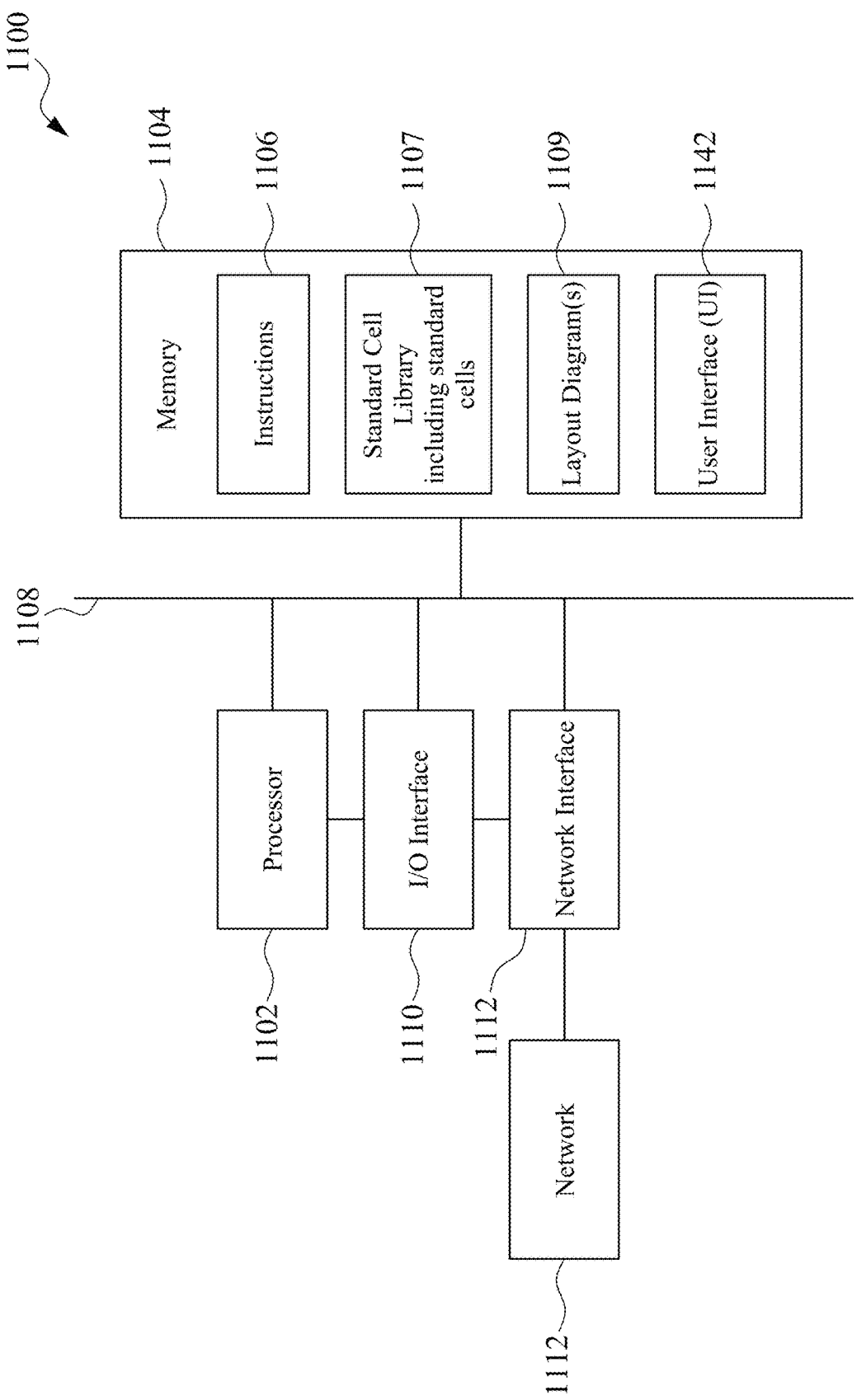
FIG. 11 is a block diagram of an electronic design automation (EDA) system in accordance with some embodiments.

FIG. 11 is a block diagram of an electronic design automation (EDA) system 1100 in accordance with some embodiments.

In some embodiments, EDA system 1100 includes an APR system. Methods described herein of designing layout diagrams represent wire routing arrangements, in accordance with one or more embodiments, are implementable, for example, using EDA system 1100, in accordance with some embodiments.

In some embodiments, EDA system 1100 is a general purpose computing device including a hardware processor 1102 and a non-transitory, computer-readable storage medium 1104. Storage medium 1104, amongst other things, is encoded with, i.e., stores, computer program code 1106, i.e., a set of executable instructions. Execution of instructions 1106 by hardware processor 1102 represents (at least in part) an EDA tool which implements a portion or all of the methods described herein in accordance with one or more embodiments (hereinafter, the noted processes and/or methods).

Processor 1102 is electrically coupled to computer-readable storage medium 1104 via a bus 1108. Processor 1102 is also electrically coupled to an I/O interface 1110 by bus 1108. A network interface 1112 is also electrically connected to processor 1102 via bus 1108. Network interface 1112 is connected to a network 1114, so that processor 1102 and computer-readable storage medium 1104 are capable of connecting to external elements via network 1114. Processor 1102 is configured to execute computer program code 1106 encoded in computer-readable storage medium 1104 in order to cause system 1100 to be usable for performing a portion or all of the noted processes and/or methods. In one or more embodiments, processor 1102 is a central processing unit (CPU), a multi-processor, a distributed processing system, an application specific integrated circuit (ASIC), and/or a suitable processing unit.

In one or more embodiments, computer-readable storage medium 1104 is an electronic, magnetic, optical, electromagnetic, infrared, and/or a semiconductor system (or apparatus or device). For example, computer-readable storage medium 1104 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1104 includes a compact disk-read only memory (CD-ROM), a compact disk-read/write (CD-R/W), and/or a digital video disc (DVD).

In one or more embodiments, storage medium 1104 stores computer program code 1106 configured to cause system 1100 (where such execution represents (at least in part) the EDA tool) to be usable for performing a portion or all of the noted processes and/or methods. In one or more embodiments, storage medium 1104 also stores information which facilitates performing a portion or all of the noted processes and/or methods. In one or more embodiments, storage medium 1104 stores library 1107 of standard cells including such standard cells as disclosed herein. In one or more embodiments, storage medium 1104 stores one or more layout diagrams 1109 corresponding to one or more layouts disclosed herein.

EDA system 1100 includes I/O interface 1110. I/O interface 1110 is coupled to external circuitry. In one or more embodiments, I/O interface 1110 includes a keyboard, keypad, mouse, trackball, trackpad, touchscreen, and/or cursor direction keys for communicating information and commands to processor 1102.

EDA system 1100 also includes network interface 1112 coupled to processor 1102. Network interface 1112 allows system 1100 to communicate with network 1114, to which one or more other computer systems are connected. Network interface 1112 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1100.

System 1100 is configured to receive information through I/O interface 1110. The information received through I/O interface 1110 includes one or more of instructions, data, design rules, libraries of standard cells, and/or other parameters for processing by processor 1102. The information is transferred to processor 1102 via bus 1108. EDA system 1100 is configured to receive information related to a UI through I/O interface 1110. The information is stored in computer-readable medium 1104 as user interface (UI) 1142.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1100. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 12:
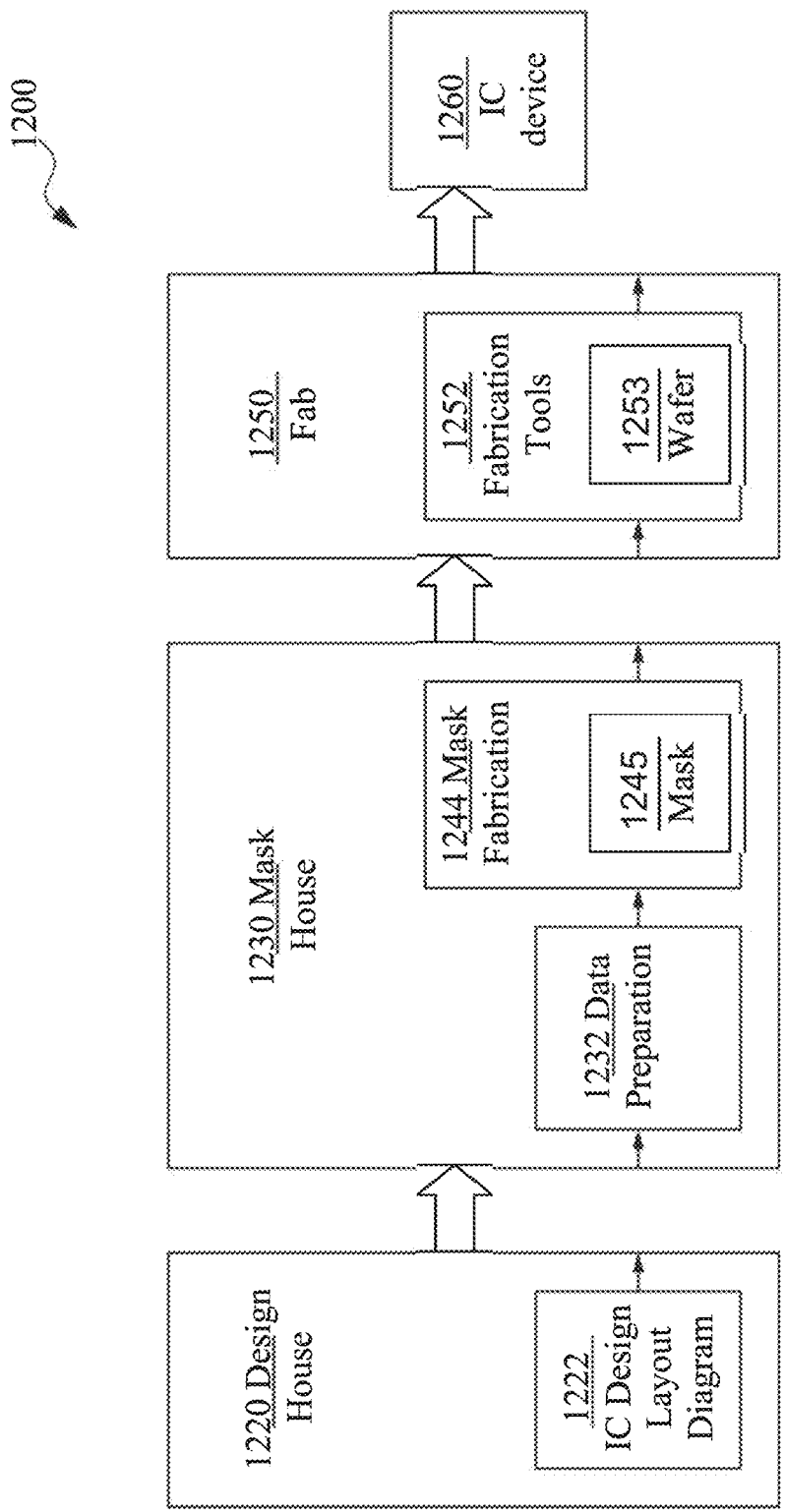
FIG. 12 is a block diagram of an integrated circuit (IC) manufacturing system, and an IC manufacturing flow associated therewith, in accordance with some embodiments.

FIG. 12 is a block diagram of an integrated circuit (IC) manufacturing system 1200, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1200.

In FIG. 12, IC manufacturing system 1200 includes entities, such as a design house 1220, a mask house 1230, and an IC manufacturer/fabricator ("fab") 1250, that interact with one another in the design, development, and manufacturing cycles and/or services related to manufacturing an IC device 1260. The entities in system 1200 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1220, mask house 1230, and IC fab 1250 is owned by a single larger company. In some embodiments, two or more of design house 1220, mask house 1230, and IC fab 1250 coexist in a common facility and use common resources.

Design house (or design team) 1220 generates an IC design layout diagram 1222. IC design layout diagram 1222 includes various geometrical patterns designed for an IC device 1260. The geometrical patterns correspond to patterns of metal, oxide, or semiconductor layers that make up the various components of IC device 1260 to be fabricated. The various layers combine to form various IC features. For example, a portion of IC design layout diagram 1222 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1220 implements a proper design procedure to form IC design layout diagram 1222. The design procedure includes one or more of logic design, physical design or place and route. IC design layout diagram 1222 is presented in one or more data files having information of the geometrical patterns. For example, IC design layout diagram 1222 can be expressed in a GDSII file format or DFII file format.

Mask house 1230 includes data preparation 1232 and mask fabrication 1244. Mask house 1230 uses IC design layout diagram 1222 to manufacture one or more masks 1245 to be used for fabricating the various layers of IC device 1260 according to IC design layout diagram 1222. Mask house 1230 performs mask data preparation 1232, where IC design layout diagram 1222 is translated into a representative data file ("RDF"). Mask data preparation 1232 provides the RDF to mask fabrication 1244. Mask fabrication 1244 includes a mask writer. A mask writer converts the RDF to an image on a substrate, such as a mask (reticle) 1245 or a semiconductor wafer 1253. The design layout diagram 1222 is manipulated by mask data preparation 1232 to comply with particular characteristics of the mask writer and/or requirements of IC fab 1250. In FIG. 12, mask data preparation 1232 and mask fabrication 1244 are illustrated as separate elements. In some embodiments, mask data preparation 1232 and mask fabrication 1244 can be collectively referred to as mask data preparation.

In some embodiments, mask data preparation 1232 includes optical proximity correction (OPC) which uses lithography enhancement techniques to compensate for image errors, such as those that can arise from diffraction, interference, other process effects and the like. OPC adjusts IC design layout diagram 1222. In some embodiments, mask data preparation 1232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1232 includes a mask rule checker (MRC) that checks the IC design layout diagram 1222 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1222 to compensate for limitations during mask fabrication 1244, which may undo part of the modifications performed by OPC in order to meet mask creation rules.

In some embodiments, mask data preparation 1232 includes lithography process checking (LPC) that simulates processing that will be implemented by IC fab 1250 to fabricate IC device 1260. LPC simulates this processing based on IC design layout diagram 1222 to create a simulated manufactured device, such as IC device 1260. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1222.

It should be understood that the above description of mask data preparation 1232 has been simplified for the purposes of clarity. In some embodiments, data preparation 1232 includes additional features such as a logic operation (LOP) to modify the IC design layout diagram 1222 according to manufacturing rules. Additionally, the processes applied to IC design layout diagram 1222 during data preparation 1232 may be executed in a variety of different orders.

After mask data preparation 1232 and during mask fabrication 1244, a mask 1245 or a group of masks 1245 are fabricated based on the modified IC design layout diagram 1222. In some embodiments, mask fabrication 1244 includes performing one or more lithographic exposures based on IC design layout diagram 1222. In some embodiments, an electron-beam (e-beam) or a mechanism of multiple e-beams is used to form a pattern on a mask (photomask or reticle) 1245 based on the modified IC design layout diagram 1222. Mask 1245 can be formed in various technologies. In some embodiments, mask 1245 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1245 includes a transparent substrate (e.g., fused quartz) and an opaque material (e.g., chromium) coated in the opaque regions of the binary mask. In another example, mask 1245 is formed using a phase shift technology. In a phase shift mask (PSM) version of mask 1245, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1244 is used in a variety of processes. For example, such a mask(s) is used in an ion implantation process to form various doped regions in semiconductor wafer 1253, in an etching process to form various etching regions in semiconductor wafer 1253, and/or in other suitable processes.

IC fab 1250 is an IC fabrication business that includes one or more manufacturing facilities for the fabrication of a variety of different IC products. In some embodiments, IC Fab 1250 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1250 includes fabrication tools 1252 configured to execute various manufacturing operations on semiconductor wafer 1253 such that IC device 1260 is fabricated in accordance with the mask(s), e.g., mask 1245. In various embodiments, fabrication tools 1252 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1250 uses mask(s) 1245 fabricated by mask house 1230 to fabricate IC device 1260. Thus, IC fab 1250 at least indirectly uses IC design layout diagram 1222 to fabricate IC device 1260. In some embodiments, semiconductor wafer 1253 is fabricated by IC fab 1250 using mask(s) 1245 to form IC device 1260. In some embodiments, the IC fabrication includes performing one or more lithographic exposures based at least indirectly on IC design layout diagram 1222. Semiconductor wafer 1253 includes a silicon substrate or other proper substrate having material layers formed thereon. Semiconductor wafer 1253 further includes one or more of various doped regions, dielectric features, multilevel interconnects, and the like (formed at subsequent manufacturing steps).

Details regarding an integrated circuit (IC) manufacturing system (e.g., system 1200 of FIG. 12), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

An aspect of the present disclosure relates to an integrated circuit. The integrated circuit includes a substrate and a semiconductor structure on the substrate, a gate-conductor intersecting the semiconductor structure at a channel region of a transistor, a drain terminal-conductor intersecting the semiconductor structure, and a source terminal-conductor intersecting the semiconductor structure. The semiconductor structure extends in a first direction within an active zone. The integrated circuit also includes a front-side horizontal conducting line extending in the first direction in a first metal layer and a front-side vertical conducting line extending in a second direction in a second metal layer. The second direction is perpendicular to the first direction. The first metal layer is above the gate-conductor and each of the drain terminal-conductor and the source terminal-conductor, and the front-side horizontal conducting line is directly connected to the drain terminal-conductor through a front-side terminal via-connector. The second metal layer is above the first metal layer, and wherein the front-side vertical conducting line is directly connected to the front-side horizontal conducting line through a front-side metal-to-metal via-connector. The integrated circuit further includes a front-side fuse element having a first fuse terminal conductively connected to the front-side vertical conducting line, and a backside conducting line directly connected to the source terminal-conductor through a backside terminal via-connector.

Another of the present disclosure relates to an integrated circuit. The integrated circuit includes a substrate, a semiconductor structure on the substrate, a gate-conductor intersecting the semiconductor structure at a channel region of a transistor, a source terminal-conductor intersecting the semiconductor structure at a source region of the transistor, and a drain terminal-conductor intersecting the semiconductor structure at a drain region of the transistor. The semiconductor structure extends in a first direction within an active zone. The integrated circuit also includes a first front-side horizontal conducting line extending in the first direction in a first metal layer, a backside conducting line directly connected to the drain terminal-conductor through a backside terminal via-connector, and a backside fuse element conductively connected to the backside conducting line. The first metal layer is above the gate-conductor and each of the source terminal-conductor and the drain terminal-conductor, and the first front-side horizontal conducting line is directly connected to the source terminal-conductor through a front-side terminal via-connector.

Still another of the present disclosure relates to a method. The method includes fabricating a plurality of transistors on a front-side of a substrate. The transistor includes a gate-conductor, a source terminal-conductor, and a drain terminal-conductor. The method includes depositing insulating materials over the gate-conductor and each of the source terminal-conductor and the drain terminal-conductor. The method also includes depositing a first metal layer over the insulating materials and patterning the first metal layer to form front-side horizontal conducting lines extending in a first direction. The front-side horizontal conducting lines include a front-side horizontal conducting line directly connected to the source terminal-conductor through a front-side terminal via-connector. The method also includes depositing a second metal layer over a layer of inter-layer dielectric that overlies the first metal layer and patterning the second metal layer to form front-side vertical conducting lines extending in a second direction that is perpendicular to the first direction. A front-side vertical conducting line is directly connected to the front-side horizontal conducting line through a front-side metal-to-metal via-connector. The method also includes depositing a first backside metal layer at a backside of the substrate and patterning the first backside metal layer to form backside first-metal conducting lines which includes a backside first-metal conducting line directly connected to the drain terminal-conductor through a backside terminal via-connector. The method also includes depositing a second backside metal layer over a first layer of backside inter-layer dielectric overlying the first backside metal layer and patterning the second backside metal layer to form backside second-metal conducting lines which includes a backside second-metal conducting line directly connected to the backside first-metal conducting line through a metal-to-metal via-connector. The method further includes forming a backside fuse element either in the second backside metal layer or in a third backside metal layer. The third backside metal layer is over a second layer of backside inter-layer dielectric overlying the second backside metal layer, and the backside fuse element is conductively connected to the backside second-metal conducting line.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit comprising:
   a substrate;
   a semiconductor structure having active regions therein on the substrate, wherein the semiconductor structure extends in a first direction within an active zone;
   a gate-conductor intersecting the semiconductor structure at a channel region of a transistor;
   a drain terminal-conductor intersecting the semiconductor structure;
   a source terminal-conductor intersecting the semiconductor structure;
   a front-side horizontal conducting line extending in the first direction in a first metal layer, wherein the first metal layer is above the gate-conductor and each of the drain terminal-conductor and the source terminal-conductor, and wherein the front-side horizontal conducting line is directly connected to the drain terminal-conductor through a front-side terminal via-connector;
   a front-side vertical conducting line extending in a second direction in a second metal layer, the second direction being perpendicular to the first direction, wherein the second metal layer is above the first metal layer, and wherein the front-side vertical conducting line is directly connected to the front-side horizontal conducting line through a front-side metal-to-metal via-connector;
   a front-side fuse element having a first fuse terminal conductively connected to the front-side vertical conducting line; and
   a backside conducting line directly connected to the source terminal-conductor through a backside terminal via-connector, and wherein the backside conducting line and the front-side fuse element are at opposite sides of the substrate.

2. The integrated circuit of claim 1, further comprising:
   a bit connection line extending in the second direction, wherein the bit connection line is directly connected to a second fuse terminal of the front-side fuse element.

3. The integrated circuit of claim 1, further comprising:
   a word connection line extending in the first direction, wherein the word connection line is directly connected to the gate-conductor through a gate via-connector.

4. The integrated circuit of claim 1, wherein the backside conducting line is a backside horizontal conducting line extending in the first direction in a first backside metal layer, and wherein the backside horizontal conducting line is directly connected to the source terminal-conductor through the backside terminal via-connector.

5. The integrated circuit of claim 4, further comprising:
   a backside vertical conducting line extending in the second direction in a second backside metal layer, wherein the backside vertical conducting line is directly connected to the backside horizontal conducting line through a backside metal-to-metal via-connector, and wherein the first backside metal layer is between the substrate and the second backside metal layer.

6. The integrated circuit of claim 1, wherein the backside conducting line is a backside vertical conducting line extending in the first direction in a first backside metal layer, and wherein the backside vertical conducting line is directly connected to the source terminal-conductor through the backside terminal via-connector.

7. The integrated circuit of claim 6, further comprising:
   a backside horizontal conducting line extending in the second direction in a second backside metal layer, wherein the backside vertical conducting line is directly connected to the backside horizontal conducting line through a backside metal-to-metal via-connector, and wherein the first backside metal layer is between the substrate and the second backside metal layer.

8. An integrated circuit comprising:
   a substrate;
   a semiconductor structure having active regions therein on the substrate, wherein the semiconductor structure is on a front-side of the substrate and extends in a first direction within an active zone;
   a gate-conductor intersecting the semiconductor structure at a channel region of a transistor;
   a source terminal-conductor intersecting the semiconductor structure at a source region of the transistor;
   a drain terminal-conductor intersecting the semiconductor structure at a drain region of the transistor;
   a first front-side horizontal conducting line extending in the first direction in a first metal layer, wherein the first metal layer is above the gate-conductor and each of the source terminal-conductor and the drain terminal-conductor, and wherein the first front-side horizontal conducting line is directly connected to the source terminal-conductor through a front-side terminal via-connector;
   a backside conducting line directly connected to the drain terminal-conductor through a backside terminal via-connector, and wherein the backside conducting line is on a backside of the substrate; and
   a backside fuse element conductively connected to the backside conducting line, and wherein the backside fuse element and the first front-side horizontal conducting line are at opposite sides of the substrate.

9. The integrated circuit of claim 8, wherein the backside conducting line is a backside horizontal conducting line extending in the first direction in a first backside metal layer.

10. The integrated circuit of claim 9, further comprising:
    a backside vertical conducting line extending in a second direction in a second backside metal layer, the second direction being perpendicular to the first direction;
    wherein the backside vertical conducting line is directly connected to the backside horizontal conducting line through a backside metal-to-metal via-connector; and
    wherein the backside fuse element is conductively connected to the backside vertical conducting line through a via connector.

11. The integrated circuit of claim 9, wherein the backside fuse element is in a third backside metal layer.

12. The integrated circuit of claim 8, wherein the backside conducting line is a backside vertical conducting line extending in a second direction in a first backside metal layer, the second direction being perpendicular to the first direction.

13. The integrated circuit of claim 12, further comprising:
    a backside horizontal conducting line extending in the first direction in a second backside metal layer;

wherein the backside vertical conducting line is directly connected to the backside horizontal conducting line through a backside metal-to-metal via-connector; and wherein the backside fuse element is conductively connected to the backside horizontal conducting line through a via connector.

14. The integrated circuit of claim 12, wherein the backside fuse element is in the first backside metal layer.

15. The integrated circuit of claim 8, further comprising:
a second front-side horizontal conducting line extending in the first direction in the first metal layer, wherein the second front-side horizontal conducting line is directly connected to the drain terminal-conductor through a second front-side terminal via-connector; and
a front-side fuse element conductively connected to the second front-side horizontal conducting line.

16. The integrated circuit of claim 15, further comprising:
a second front-side vertical conducting line extending in a second direction in a second metal layer, the second direction being perpendicular to the first direction wherein the second front-side vertical conducting line is directly connected to the second front-side horizontal conducting line through a front-side metal-to-metal via-connector; and
wherein the front-side fuse element is conductively connected to the second front-side vertical conducting line.

17. A method comprising:
fabricating a plurality of transistors on a front-side of a substrate, wherein the transistor includes a gate-conductor, a source terminal-conductor, and a drain terminal-conductor;
depositing insulating materials over the gate-conductor and each of the source terminal-conductor and the drain terminal-conductor;
depositing a first metal layer over the insulating materials and patterning the first metal layer to form front-side horizontal conducting lines extending in a first direction, and wherein the front-side horizontal conducting lines include a front-side horizontal conducting line directly connected to the source terminal-conductor through a front-side terminal via-connector;
depositing a second metal layer over a layer of inter-layer dielectric that overlies the first metal layer and patterning the second metal layer to form front-side vertical conducting lines extending in a second direction that is perpendicular to the first direction, and wherein a front-side vertical conducting line is directly connected to the front-side horizontal conducting line through a front-side metal-to-metal via-connector;
depositing a first backside metal layer at a backside of the substrate and patterning the first backside metal layer to form backside first-metal conducting lines which includes a backside first-metal conducting line directly connected to the drain terminal-conductor through a backside terminal via-connector;
depositing a second backside metal layer over a first layer of backside inter-layer dielectric overlying the first backside metal layer and patterning the second backside metal layer to form backside second-metal conducting lines which includes a backside second-metal conducting line directly connected to the backside first-metal conducting line through a metal-to-metal via-connector; and
forming a backside fuse element either in the second backside metal layer or in a third backside metal layer, wherein the third backside metal layer is over a second layer of backside inter-layer dielectric overlying the second backside metal layer, wherein the backside fuse element is conductively connected to the backside second-metal conducting line.

18. The method of claim 17, wherein the backside first-metal conducting line is a backside horizontal conducting line extending in the first direction and the backside second-metal conducting line is a backside vertical conducting line extending in the second direction, wherein forming the backside fuse element comprises:
forming the backside fuse element in the third backside metal layer.

19. The method of claim 17, wherein the backside first-metal conducting line is a backside vertical conducting line extending in the second direction and the backside second-metal conducting line is a backside horizontal conducting line extending in the first direction, wherein forming the backside fuse element comprises:
forming the backside fuse element in the second backside metal layer.

20. The method of claim 17, further comprising:
depositing a third backside metal layer over a second layer of backside inter-layer dielectric overlying the second backside metal layer; and
forming a front-side fuse element in the third backside metal layer conductively connected to a second front-side vertical conducting line;
wherein the patterning the first metal layer comprises patterning the first metal layer to form the front-side horizontal conducting lines which includes a second front-side horizontal conducting line directly connected to the drain terminal-conductor through a second front-side terminal via-connector,
wherein the patterning the second metal layer comprises patterning the second metal layer to form the front-side vertical conducting lines which includes the second front-side vertical conducting line directly connected to the second front-side horizontal conducting line through a second front-side metal-to-metal via-connector.

* * * * *